US008605843B2

(12) United States Patent
Dupont et al.

(10) Patent No.: US 8,605,843 B2
(45) Date of Patent: Dec. 10, 2013

(54) METHOD AND APPARATUS FOR SIGNAL ACQUISITION IN OFDM RECEIVERS

(76) Inventors: Louis Dupont, Ste-Foy (CA); Sébastien Joseph Armand Roy, Beaumont (CA)

( * ) Notice: Subject to any disclaimer, the term of this patent is extended or adjusted under 35 U.S.C. 154(b) by 543 days.

(21) Appl. No.: 12/672,663

(22) PCT Filed: Aug. 6, 2008

(86) PCT No.: PCT/CA2008/001407
§ 371 (c)(1),
(2), (4) Date: Feb. 8, 2010

(87) PCT Pub. No.: WO2009/018655
PCT Pub. Date: Feb. 12, 2009

(65) Prior Publication Data
US 2011/0293040 A1 Dec. 1, 2011

Related U.S. Application Data

(60) Provisional application No. 60/935,304, filed on Aug. 6, 2007.

(51) Int. Cl.
H04B 7/10 (2006.01)

(52) U.S. Cl.
USPC .......... 375/347; 341/180; 370/464; 375/260; 375/267; 375/299; 455/101

(58) Field of Classification Search
None
See application file for complete search history.

(56) References Cited

U.S. PATENT DOCUMENTS

| | | | |
|---|---|---|---|
| 7,039,000 B2 | 5/2006 | You et al. | |
| 7,039,140 B2 | 5/2006 | Reagan et al. | |
| 7,286,617 B2 | 10/2007 | Vanderperren et al. | |
| 2004/0005022 A1* | 1/2004 | Zhu et al. | 375/365 |
| 2004/0047368 A1 | 3/2004 | Xu | |
| 2005/0163261 A1 | 7/2005 | Nakao | |
| 2006/0014494 A1 | 1/2006 | Vanderperren et al. | |
| 2006/0222095 A1 | 10/2006 | Niu et al. | |
| 2007/0047433 A1* | 3/2007 | Kao | 370/208 |
| 2007/0053461 A1 | 3/2007 | Nakao | |

FOREIGN PATENT DOCUMENTS

CN 1427495 7/2003

OTHER PUBLICATIONS

Roy et al; "A Codesign Prototyping Framework for Wireless LAN Transceivers with Smart Antennas", Proceedings of the 16th International Conference on Computer Communications and Networks, Aug. 13-16, 2007, pp. 1008-1015.
Roy et al, "An End-to-End Prototyping Framework for Compliant Wireless LAN Transceivers with Smart Antennas", Computer Communications, vol. 31 issue 8, May 25, 2008.

(Continued)

Primary Examiner — Adolf Dsouza
(74) Attorney, Agent, or Firm — Ridout & Maybee LLP

(57) ABSTRACT

A method and apparatus for signal acquisition in an OFDM receiver relies on a preamble training sequence to synchronize the receiver in time (e.g. determining the start of a frame) and in frequency (carrier frequency offset compensation). The preamble training sequence has a periodic structure and the method and apparatus perform a cross-correlation technique using a matched filter to achieve time synchronization and/or frequency synchronization and/or channel estimation, the latter being especially useful in multi-antenna receivers for diversity combining purposes. Many advantages derive from performing at least two and preferably all three operations jointly, in terms of latency, hardware complexity, and length of training sequence required to achieve satisfactory convergence on all counts. The periodicity of the training sequence is exploited to reduce considerably the main filter complexity and optionally dynamically adjust carrier offset compensation throughout the filtering process.

30 Claims, 13 Drawing Sheets

(56) References Cited

OTHER PUBLICATIONS

Wang Yong et al "A Novel Scheme for Symbol Timing in OFDM WLAN Systems", IEEE International Symposium on Communications and Information Technology, vol. 2, Oct. 26-29, 2004, pp. 642-645.

* cited by examiner

METHOD AND APPARATUS FOR SIGNAL ACQUISITION IN OFDM RECEIVERS

CROSS-REFERENCE TO RELATED APPLICATIONS

This application claims priority from U.S. Provisional patent application No. 60/935,304 filed Aug. 6, 2007, the entire contents of which are incorporated herein by reference.

TECHNICAL FIELD

The present invention relates to a method and apparatus for signal acquisition in Orthogonal Frequency Division Multiplex (OFDM) receivers. The invention is especially, but not exclusively, applicable to OFDM radio receivers.

BACKGROUND ART

Wireless communications pose many challenges. Among them, multi-path fading, generated as the same signal is received through different paths and implicitly different phases, is perhaps the most problematic. To address this issue, orthogonal frequency division multiplexing (OFDM) systems were developed.

OFDM systems separate the transmission channel into several sub-carrier frequencies. Data is then transmitted on each of those sub-carriers in parallel. The symbols are spread across the different carriers and each of them occupies only a small portion of the frequency band; however, the symbols are relatively long in duration. This parallelism allows the symbol duration for a given data rate to be extended, thus providing immunity to dispersive fading which would otherwise cause intersymbol interference. This immunity, which leads to greatly simplified equalization schemes to compensate for channel effects, motivated many bodies, among them the IEEE 802.11 and the ETSI HIPERLAN committees, to adopt OFDM through their wireless standards.

Unfortunately, OFDM systems present many obstacles for practical and reliable operation. OFDM systems are particularly sensitive to time and frequency synchronization issues. For reliable operation, the receiver ideally should know not only the exact position of each frame of the received signal in time, but also the transmitter's oscillator frequency. Transmitter and receiver radio frequency oscillators are usually not perfectly frequency locked. In fact, both of the afore-mentioned IEEE 802.11a and ETSI HIPERLAN/2 standards state that a given oscillator can deviate by a maximum of 20 ppm from the carrier frequency associated with a given channel, thus generating a carrier frequency offset (CFO). OFDM systems are especially sensitive to CFO. Virtually all receivers use a downconverter before A/D conversion in order to subsequently perform digital signal processing at baseband. The received signal is then represented as an amplitude as well as a phase, relative to the oscillator, in the complex plane. The CFO generates a linearly increasing phase offset for each time sample at baseband. Given knowledge of that phase offset, the CFO can be corrected simply by applying the opposite offset to the received time samples.

Synchronization and CFO compensation techniques are known which exploit known periodically-repeating signals added at the beginning of radio packets transmitted in OFDM systems, forming part of the so-called preamble of such packets. Packets in OFDM systems conforming to IEEE 802.11a and the ERP-OFDM clause of IEEE 802.11g standards exhibit this structure. These standards specify a physical layer convergence protocol (PLCP) preamble that is used for synchronization and CFO compensation purposes. In receivers equipped with multiple antennas, the preamble can also be used for channel gain and phase estimation to support subsequent combining of signals from said multiple antennas.

FIG. 2 details the structure of the preamble that is prepended to the signal and data symbols in each OFDM packet under 802.11a and 802.11g/ERP-OFDM standards. Symbols t1 through t10 of the preamble comprise short training symbols and symbols T1 and T2 of the preamble comprise long training symbols. The short symbols are all identical, and together form the short symbol training sequence (herein referred to as SSTS), which is periodic with a period of 800 ns. Likewise, the long training symbols T1 and T2 are identical and, together with guard interval GI2, which consists of a copy of the latter half of a long symbol, form the long symbol training sequence, (herein referred to as LSTS). Together, the SSTS and LSTS are intended to serve the functions of signal presence detection, automatic gain control (AGC), diversity selection, coarse and fine CFO estimation and compensation, timing synchronization, and channel estimation for equalization and diversity combining purposes.

Most time synchronization algorithms for OFDM WLANs are based on either auto-correlation (correlation of the received signal with itself, exploiting known statistical properties of the transmitted signal) or cross-correlation (correlation of the received signal with a known training sequence) techniques. Both techniques usually exploit the short, periodic training sequence preceding each frame (the SSTS). In the 802.11 and HIPERLAN/2 OFDM frame structure, for example, the SSTS is actually a repetition in time of the same 16 samples 10 times, assuming the typical 20 Mhz sample rate. In the widespread, so-called maximum-likelihood (ML) approach, the periodic nature of the SSTS is exploited through auto-correlation techniques, widely used since they can not only perform time synchronization but also frequency synchronization. The auto-correlation function $R(\tau)$ is usually computed for $\tau=16$, the period of the short sequence at the typical sampling rate of 20 Mhz in 802.11a and 802.11g implementations.

Unfortunately, time synchronization based on the auto-correlation function exhibits poor performance in the presence of a Rayleigh fading dispersive channel. Cross-correlation techniques are used instead to efficiently perform time synchronization in such channels. Cross-correlation techniques are based on the low correlation of a period of the short preamble with a time-shifted version of itself. This is a typical, desirable property of most training sequences used in various communication systems (not restricted solely to OFDM modulation). In other words, the autocorrelation function is of a single period of the training sequence, designated as a short training symbol (in this case a 16-sample sequence), approximates a Kronecker delta function which takes on a maximum value at a delay of 0, and is equal to 0 everywhere else. However, known techniques using cross-correlation before carrier frequency offset has been corrected are not entirely satisfactory because the CFO leads to ambiguity.

Examples of US patent documents which disclose synchronization algorithms for OFDM WLANs are as follows:

U.S. Pat. No. 7,039,000 (You et al., 2006) first performs a coarse timing estimate exploiting the autocorrelation technique using R(80) rather than R(16). Received samples are then interpolated to perform a fine oversampled timing estimate using again the autocorrelation technique.

U.S. Pub. Appln. No. 2004/0047368 (Xu) exploits both a matched filter and the auto-correlation function through a hybrid design. Basically, both functions are computed and a decision is made through a criterion based on a weighted sum of the two results. Neither frequency synchronization nor channel estimation is performed through the proposed design.

U.S. Pub. Appln. No. 2006/0014494 (Vanderperren et al.) also exploits both the auto-correlation and cross-correlation techniques. CFO as well as a coarse timing estimate are first obtained through the auto-correlation function. The CFO-corrected signal is then cross-correlated to acquire a fine timing estimate.

Both of these published applications are based on the special training symbols technique mentioned by Richard Van Nee and Ramjee Prasad in "OFDM for Wireless Multimedia Communication," Artech House, 1999, 260 pages. The technique was retargeted specifically at OFDM WLANs by Yong Wan & Ge Jian-hua, Bo Ai and Li Zong-Qiang in "A Novel Scheme for Symbol Timing in OFDM WLAN Systems", IEEE International Symposium on Communications and Information Technology, through a relatively heavy design requiring an especially large filter. No CFO estimate is performed as only the real part of the baseband received signal is exploited, also resulting in poor performance of the design.

U.S. Pat. No. 7,039,140 (Reagan et al., 2006) exploits the structure of the long preamble to perform synchronization. A large inner product must be computed for each sample suspected of being the boundary between the short and the long training symbols. As a result, the preferred embodiment supposes a coarse timing estimate to limit the number of inner products to be performed and target a real system. More particularly, U.S. Pat. No. 7,039,140 discloses a procedure for acquiring synchronization in such an OFDM system using autocorrelation between different batches of N samples in the LSTS. This exploits the periodicity of the two halves of the groups T1 and T2 in FIG. 2, a feature that is specific to the LSTS.

A drawback is that Reagan et al. require a rough timing reference before they start and obtain the synchronization retroactively insofar as they use information received after the end of the short training sequence to locate the end of the short training sequence.

It would be desirable to achieve at least the time synchronization using only the short training sequence so that the long symbol training sequence in the same preamble can be used for other purposes, such as gain control and channel selection.

An object of the present invention, at least according to some aspects, is to at least mitigate drawbacks of such known signal acquisition techniques, or provide an alternative.

In addressing this object, aspects of the invention are predicated upon the fact that, when correlated with a period of itself, the SSTS generates a distinct impulse sequence exploitable for time synchronization. Cross-correlation is simply performed through the use of a filter matched to several periods of the short preamble. This characteristic further improves the performance of the cross-correlation techniques as it provides, to some extent, immunity to Gaussian noise.

Time and frequency synchronization are not the only challenges faced by today's designers of OFDM systems as pressure on the limited radio spectrum increases. This pressure is two-fold: the number of users is growing dramatically, and the services offered and being developed are increasingly demanding in bandwidth. Antenna arrays and associated signal processing constitute the single most promising avenue to augment both user-capacity and throughput-capacity in wireless networks.

Antenna array processing is typically performed through a linear weight-and-sum operation. When the channel is approximated as narrow band, the baseband equivalent signal y at a given time is obtained from the received N×1 vector r of baseband signals on N antennas as $$y = w^H r$$

where $w^H$ is the Hermitian transpose of the N×1 complex vector w, usually computed through a narrow band channel estimate on each antenna for a given user as well as potential interferers.

Another object of the present invention, at least according to certain aspects, is to at least mitigate drawbacks of known signal acquisition techniques, or provide an alternative, in the context of radio receivers employing array antennas.

According to a first aspect of the invention, there is provided a method of signal acquisition in a communications receiver for receiving Orthogonal Frequency Division Multiplex (OFDM) signals comprising data packets each comprising a preamble training sequence having a periodic structure, the method comprising the steps of
(i) sampling a received OFDM signal to obtain received-signal samples;
(ii) filtering said samples using a matched finite impulse response (FIR) filter having an impulse response matched to said periodic structure of said preamble training sequence;
(iii) detecting occurrence of a maximum amplitude of the cross-correlation output from said FIR over a predetermined number of periods corresponding to at least part of said training sequence; and
(iv) using one or more of timing, magnitude and phase of said maximum amplitude to determine time synchronization, carrier frequency offset or channel estimation.

According to a second aspect of the invention, there is provided a method of signal acquisition in an OFDM radio receiver having an array antenna comprising a plurality of antenna elements each for receiving an individual received signal comprising data packets each comprising a preamble training sequence having a periodic structure, the method comprising the steps of:
for each antenna element:
(i) sampling its received individual radio signal to obtain a series of received-signal samples;
(ii) filtering said samples using a matched finite impulse response (FIR) filter having an impulse response matched to said periodic structure of said preamble training sequence;
(iii) detecting a series of peaks at the output of said filter, each peak corresponding to one received OFDM symbol of the preamble training sequence;
(iv) detecting a maximum amplitude of the cross-correlation output among said peaks from said FIR; and
(v) determining a channel estimate (CE) as the magnitude and phase of said maximum amplitude; and
(vi) using said magnitude and phase to weight corresponding data for that antenna element in a subsequent step of combining the individual received-signals of the antenna elements, respectively.
(vii)(a) extracting the phase difference between two of said peaks,
(vii)(b) calculating from said phase difference the phase shift induced per sample by carrier frequency offset, said phase difference being a multiple of said phase shift with the multiplication factor between the two being determined by the separation of the two peaks;
(viii) adjusting each phase shift estimate by adding such estimates for all antenna elements, each being previously weighted by the corresponding channel magnitude determined in step (v);

(ix) the adjusted phase shift estimate being used for carrier offset correction during subsequent processing steps.

According to a third aspect of the invention, there is provided a method of signal acquisition in an OFDM radio receiver having an array antenna comprising a plurality of antenna elements each for receiving an individual received signal comprising data packets each comprising a preamble training sequence having a periodic structure, the method comprising the steps of: for each antenna element:

(i) sampling its individual received signal to obtain a series of received-signal samples;

(ii) filtering the preamble samples using a matched finite impulse response (FIR) filter having an impulse response matched to said periodic structure of said preamble training sequence;

(iii) detecting a series of peaks at the output of said filter, each peak corresponding to one received OFDM symbol of the preamble training sequence;

(iv) detecting a maximum amplitude of the cross-correlation output among said peaks from said FIR; and (v) providing the timing of said maximum amplitude on any given antenna, or any combined signal created by combining the filter outputs at all antennas, as a timing reference for demodulation of said received data.

(vi) determining magnitude and phase of said maximum amplitude; and (vii) using said magnitude and phase to weight corresponding data for that antenna element in a subsequent step of combining the individual received-signals of the antenna elements, respectively.

(viii)(a) extracting the phase difference between two peaks, where said two peaks can be two consecutive peaks or can be more widely separated;

(viii)(b) calculating from said phase difference the phase shift induced per sample by the carrier frequency offset, said phase difference being a multiple of said phase shift with the factor between the two being determined by the separation of the two peaks;

(ix) adjusting a phase shift estimate by adding such estimate for all antennas, each being previously weighted by the corresponding channel magnitude determined in step (vi); and (x) the adjusted phase shift estimate being used for carrier offset correction during subsequent processing steps.

According to a fourth aspect of the invention, there is provided a method of signal acquisition in an OFDM (Orthogonal Frequency Domain Multiplexed) receiver for receiving received signals comprising data packets each comprising a preamble training sequence having a periodic structure, comprising the steps of;

(i) sampling a received OFDM radio signal to obtain a series of received-signal samples;

(ii) filtering the preamble samples using a matched finite impulse response (FIR) filter having an impulse response matched to said periodic structure of said preamble training sequence, said filtering being preceded by a complex multiplication by a correction coefficient for dynamic carrier frequency offset compensation, said coefficient being initially equal to 1;

(iii) detecting the first two peaks at the output of said filter, each peak corresponding to one received short OFDM symbol;

(iv)(a) extracting the phase difference between said two peaks;

(iv)(b) calculating from said phase difference the phase shift induced per sample by the carrier frequency offset, said phase difference being a multiple of said phase shift with the factor between the two being determined by the separation of the two peaks;

(v) multiplying the correction coefficient at the multiplier ahead of the matched filtering by a complex value of unit amplitude whose phase is minus the phase shift found in step (iv);

(vi) pursuant to the filtering step, updating the correction coefficient for every received peak as a function of the last received two peaks according to steps (iii)-(v);

(vii) detecting a maximum amplitude of the cross-correlation output among said peaks from said FIR; and (viii) providing the timing of said maximum amplitude as a timing reference for demodulation of said received data;

(ix) providing the final value of the correction coefficient as a measure of the carrier frequency offset for its compensation in subsequent steps.

According to a fifth aspect of the invention, there is provided a method of estimating and correcting carrier frequency offset and estimating from received data in an OFDM radio receiver characteristics of a transmission channel whereby said received data was received, said OFDM radio receiver having an array antenna comprising a plurality of antenna elements each for receiving an individual received signal comprising data packets each comprising a preamble training sequence having a periodic structure, the method comprising the steps of:

for each antenna element:

(i) sampling a received OFDM radio signal to obtain a series of received-signal samples;

(ii) filtering the preamble samples using a matched finite impulse response (FIR) filter having an impulse response matched to said periodic structure of said preamble training sequence, said filter being preceded by a complex multiplication by a correction coefficient for dynamic carrier frequency offset compensation, said correction coefficient being initially equal to 1;

(iii) detecting the first two peaks at the output of said filter, each peak corresponding to one received short OFDM symbol;

(iv) determining magnitude and phase of the maximum amplitude out of the said two peaks, for each antenna, said magnitude and phase constituting the current estimate of the channel coefficient associated with each antenna;

(v)(a) extracting the phase difference between said two peaks on each antenna;

(v)(b) calculating from said phase difference the phase shift induced per sample by the carrier frequency offset, said phase difference being a multiple of said phase shift with the factor between the two being determined by the separation of the two peaks;

(vi) expressing said phase shift on each antenna by a complex coefficient of unit magnitude, computing the weighted normalized sum of all such coefficients for all antennas, where the weight associated with a specific coefficient is proportional to the current channel gain estimate on the same antenna;

(vii) multiplying the correction coefficient at the multiplier ahead of the matched filter by a complex value of unit amplitude whose phase is minus the phase shift found in the to normalized sum operation of step (vi);

(viii) pursuant to the filtering operation, updating the current channel estimate and the correction coefficient for every received peak as a function of the last received two peaks according to steps (iii)-(vii)

(ix) detecting a maximum amplitude of the cross-correlation output among said peaks from said FIR; and (x) determining magnitude and phase of said maximum amplitude; and
(xi) using said magnitude and phase to weight corresponding data for that antenna element in a subsequent step of combining the individual received-signals of the antenna elements, respectively;
(xii) providing the final value of the correction coefficient as a measure of the carrier frequency offset for compensation therefor in subsequent steps.

According to a sixth aspect of the invention, there is provided a method of jointly A—estimating and correcting carrier frequency offset, B—recovering timing (synchronizing) and C—estimating from received data in an OFDM radio receiver characteristics of a transmission channel whereby said received data was received, said OFDM radio receiver having an array antenna comprising a plurality of antenna elements each for receiving an individual received signal comprising data packets each comprising a preamble training sequence having a periodic structure, the method comprising the steps of:
for each antenna element:
(i) sampling its individual received OFDM radio signal to obtain a series of received-signal samples;
(ii) filtering the preamble samples using a matched finite impulse response (FIR) filter having an impulse response matched to said periodic structure of said preamble training sequence, said filtering being preceded by a complex multiplication by a correction coefficient for dynamic carrier frequency offset compensation, said correction coefficient being initially equal to 1;
(iii) detecting the first two peaks at the output of said filter, each peak corresponding to one received OFDM symbol of the training sequence;
(iv) determining magnitude and phase of the maximum amplitude out of the said two peaks, for each antenna, said magnitude and phase constituting the current estimate of the channel coefficient associated with each antenna;
(v)(a) extracting the phase difference between said two peaks on each antenna;
(v)(b) calculating from said phase difference the phase shift induced per sample by the to carrier frequency offset, said phase difference being a multiple of said phase shift with the factor between the two being determined by the separation of the two peaks;
(vi) expressing said phase shift on each antenna by a complex coefficient of unit magnitude, computing the weighted normalized sum of all such coefficients for all antennas, where the weight associated with a specific coefficient is proportional to the current channel gain estimate on the same antenna;
(vii) multiplying the correction coefficient at the multiplier ahead of the matched filter by a complex value of unit amplitude whose phase is minus the phase found in the normalized sum operation of step (vi);
(viii) pursuant to the filtering operation, updating the current channel estimate and the correction coefficient for every received peak as a function of the last received two peaks according to steps (iii)-(vii)
(ix) detecting a maximum amplitude of the cross-correlation output among said peaks from said FIR; and
(xi) determining magnitude and phase of said maximum amplitude;
(xii) using said magnitude and phase to weight corresponding data for that antenna element in a subsequent step of combining the individual received-signals of the antenna elements, respectively,
(xiii) providing the timing of said maximum amplitude on any given antenna, or any combined signal created by combining the filter outputs at all antennas, as a timing reference for demodulation of said received data; and
(xiv) providing the final value of the correction coefficient as a measure of the carrier frequency offset for its compensation in subsequent steps.

Other aspects of the invention are OFDM receivers as specified in the independent claims.

Features of the different aspects are specified in the corresponding dependent claims.

Preferred embodiments of the invention will now be described with reference to the accompanying drawings.

DETAILED DESCRIPTION OF PREFERRED EMBODIMENTS

Figure 2:
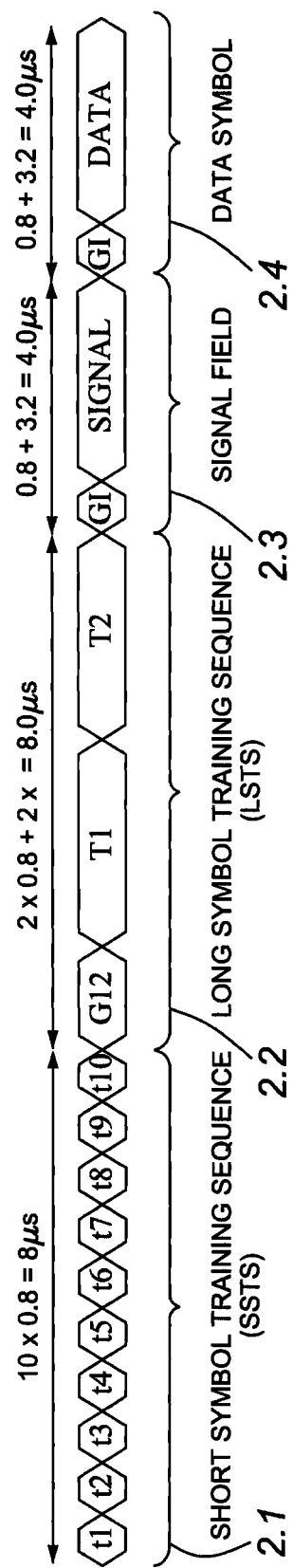
FIG. 2 is the structure of an ERP-OFDM packet according to IEEE 802.11 standard.

Before the detailed description of specific embodiments of the invention, a discussion of the theoretical basis of embodiments of the invention will be described with reference to FIGS. 2 and 3.

In order to acquire a received OFDM signal in which each packet has a preamble comprising a training sequence, embodiments of the present invention employ a cross-correlation technique where a reception filter matched to the preamble is used. As the received preamble passes through the reception filter, impulses are formed as illustrated by FIG. 3. Timing estimation is simply performed by isolating the highest impulse. The signal acquisition method can be adapted for use with a receiver having an array antenna to efficiently exploit spatial diversity to perform both time and frequency synchronization. In fact, the preferred embodiment may directly provide a channel estimate which can be used for general purpose space-time processing. That channel estimate can be used to assign a level of confidence to the information (with respect to timing and carrier frequency offset) provided through each antenna in conformity with the maximum ratio combining (MRC) principle.

Figure 3:
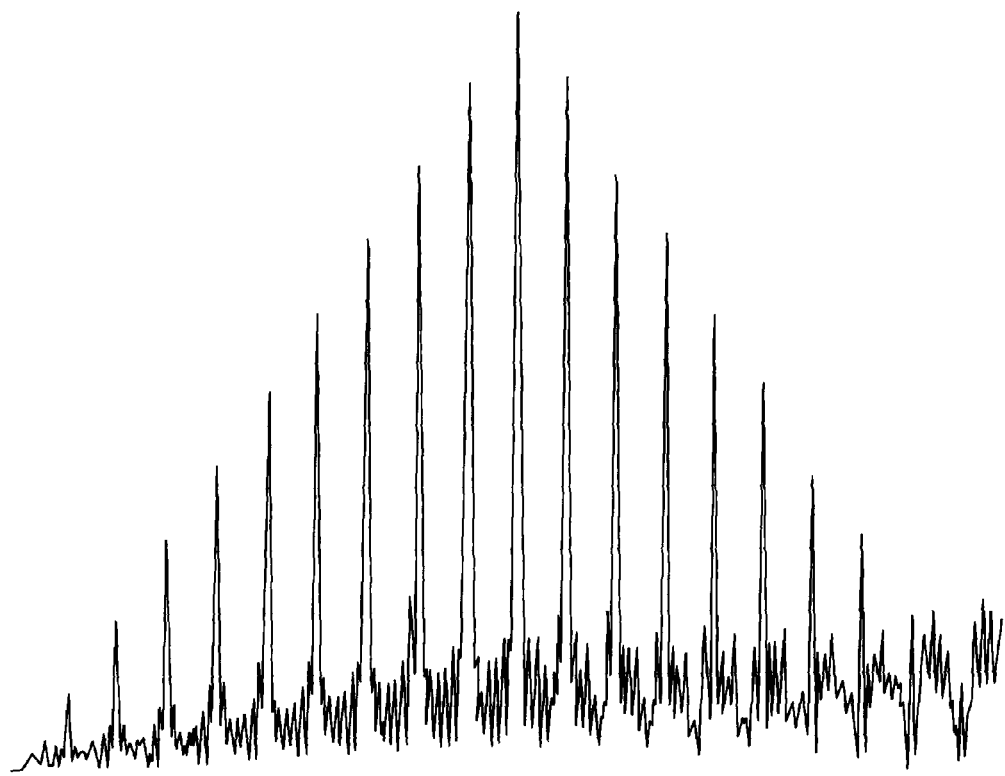
FIG. 3 illustrates the impulse sequence for synchronization.

As mentioned above, the amplitude of the convolution of the SSTS (in 802.11a and similar systems) with itself results in the sequence of impulses depicted by FIG. 3. It is noteworthy that the main impulse (maximum amplitude peak) in fact closely approximates an ideal impulse. Indeed, given the properties of the SSTS, its convolution with itself very nearly yields an ideal (Dirac delta function) impulse in continuous time and an equivalent (Kronecker delta function) impulse in discrete time. It follows that if the STSS f(t) is transmitted through a channel c(t), and the resulting received signal is again convolved with f(t), each resulting impulse in the pulse train of FIG. 3 is an expression of the channel impulse response corrupted by some noise. Thus, the output of the convolution on the ith antenna at delay 0 is $$y_i(0) = c_i$$

where $c_i$ is the narrow band channel on a given antenna and $y_i(t)$ the output of the matched filter on that antenna, the main impulse being located at t=0.

Out of many linear combining methods, the known maximal-ratio combining (MRC) approach is optimal, in the mean, when Gaussian noise is present, but no man-made interfering signals. The output of an MRC combiner is directly computed from the channel coefficient vector and the received signal vector by simply taking their inner product, i.e.

$$y = w^H_r = c^H_r$$

substituing r by cx(t)+n(t), n(t) being Gaussian, we find:

$$y = c^H(cx(t)+n(t))$$

$$y = c^H cx(t) + c^H n(t) \quad (3)$$

It is noteworthy that MRC can be seen as a weighted sum:

$$y = \sum_{i=1}^{N} c_i^* c_i x(t) + c_i^* n_i(t)$$

$$y = \sum_{i=1}^{N} |c_i|^2 x(t) + c^* n + i(t)$$

where the signal transmitted over a channel $c_i$ associated with a given antenna is simply phase-aligned with the other channels and weighted in proportion to the amplitude of the channel.

CFO estimation can also easily and efficiently take advantage of space diversity within the context of the present invention using the angle difference between consecutive peaks in FIG. 3. Indeed, the SSTS found in the 802.11a and 802.11g/ERP-OFDM preamble structure is periodic as depicted by FIG. 2. Assuming a 20 MHz sample rate at baseband and given $f_p(t)$, a period of the SSTS f(t), we have $$f(t) = f_p(t) \otimes \sum_{i=0}^{9} \delta(t - 16l),$$

where $\otimes$ denote convolution, and the equation reflects the fact that there are 10 short symbols of 16 samples each.

As a result, the impulse sequence at the output of the matched filter (FIG. 3) can $$f(t) \otimes r_i(t) = f_p(t) \otimes \sum_{i=0}^{9} \delta(t - 16l) \otimes \left( c_i(t) f_p(t) \otimes \sum_{i=0}^{9} \delta(t - 16l) + n_i(t) \right),$$

be expressed as:

where $r_i(t)$ is the received signal on the ith antenna, $c_i(t)$ is the ith antenna channel (and the equation implicitly assumes that the channel is flat fading and can be modelled as a single complex coefficient), and $n_i(t)$ is the noise.

Given that $f_P(t) \otimes f_P(t) \approx \delta(t)$, introducing a CFO relative to the transmitter at the receiver and letting the narrowband channel $c_i(t) = k_i e^{j\phi}$, the expression can be rewritten as:

$$f(t) \otimes r_i(t) = k_i e^{j\phi_1} \sum_{l=0}^{9} \delta(t - 16l) \otimes \sum_{i=0}^{9} \delta(t - 16l) e^{j16\psi l} + v(t),$$

$$= k_i \left[ \sum_{l=0}^{9} \sum_{m=0}^{9-l} \delta(t + 16l) e^{j(16\psi m + \phi_1)} + \sum_{l=1}^{9} \sum_{m=0}^{9-l} \delta(i - 16l) e^{j(16\psi[m-1] + \phi_2)} \right],$$

where ψ denotes the CFO-induced phase shift between two consecutive samples.

Considering the phase difference between $y_1(0)$ the highest impulse and the preceding one $y_1(-167)$ (T being the sample period), we have in general the expression:

$$\angle y_i(0) - \angle y_1(-LT) = \angle \sum_{l=0}^{N_p-1} e^{j(l\psi L + \phi_n)} - \angle \sum_{k=0}^{N_p-2} e^{j(l\psi L + \phi_c)}$$

$$= \angle \frac{1 - e^{j(N_p \psi L)}}{1 - e^{j(\psi L)}} - \angle \frac{1 - e^{j((N_p-1)\psi L)}}{1 - e^{j(\psi L)}}$$

$$= \angle 1 - e^{j(N_p \psi L)} - \angle 1 - e^{j((N_p-1)\psi L)}$$

$$= \frac{N_p \psi L}{2} - \frac{(N_p - 1)\psi L}{2}$$

$$= \frac{L\psi}{2}$$

where L is the length in samples of a single short symbol (equal to 16 according to the scenario presented above) and $N_p$ is the number of such symbols in the SSTS (equal to 10 in the 802.11a preamble structure). The passage from the first to the second line is based on the identity $$\sum_{n=0}^{DC} a^n = \frac{1}{1-c},$$

and the passage from the third to the fourth line is based on application of several basic trigonometric identities.

Spatial diversity can be easily exploited to provide a better estimation according to $$\psi = \frac{1}{N} \sum_{i=1}^{N} |c_i| / (y_i(0) y_i^*(-16T))$$

$$= \frac{1}{N} / \left( \sum_{i=1}^{N} \frac{y_i(0) y_c^*(-16T)}{|c_i|} \right),$$

where N is the number of antennas and each antenna provides a CFO estimate weighted by $|c_i|$ in conformity with the MRC principle.

First Preferred Embodiment

The configuration of a first preferred embodiment, namely an OFDM array receiver which performs, jointly, time synchronization, CFO estimation and channel estimation, will now be described with reference to FIG. 1, and its operation with reference to FIG. 5, specifically with regard to implementation of the signal acquisition functions required of an OFDM receiver.

Figure 1:
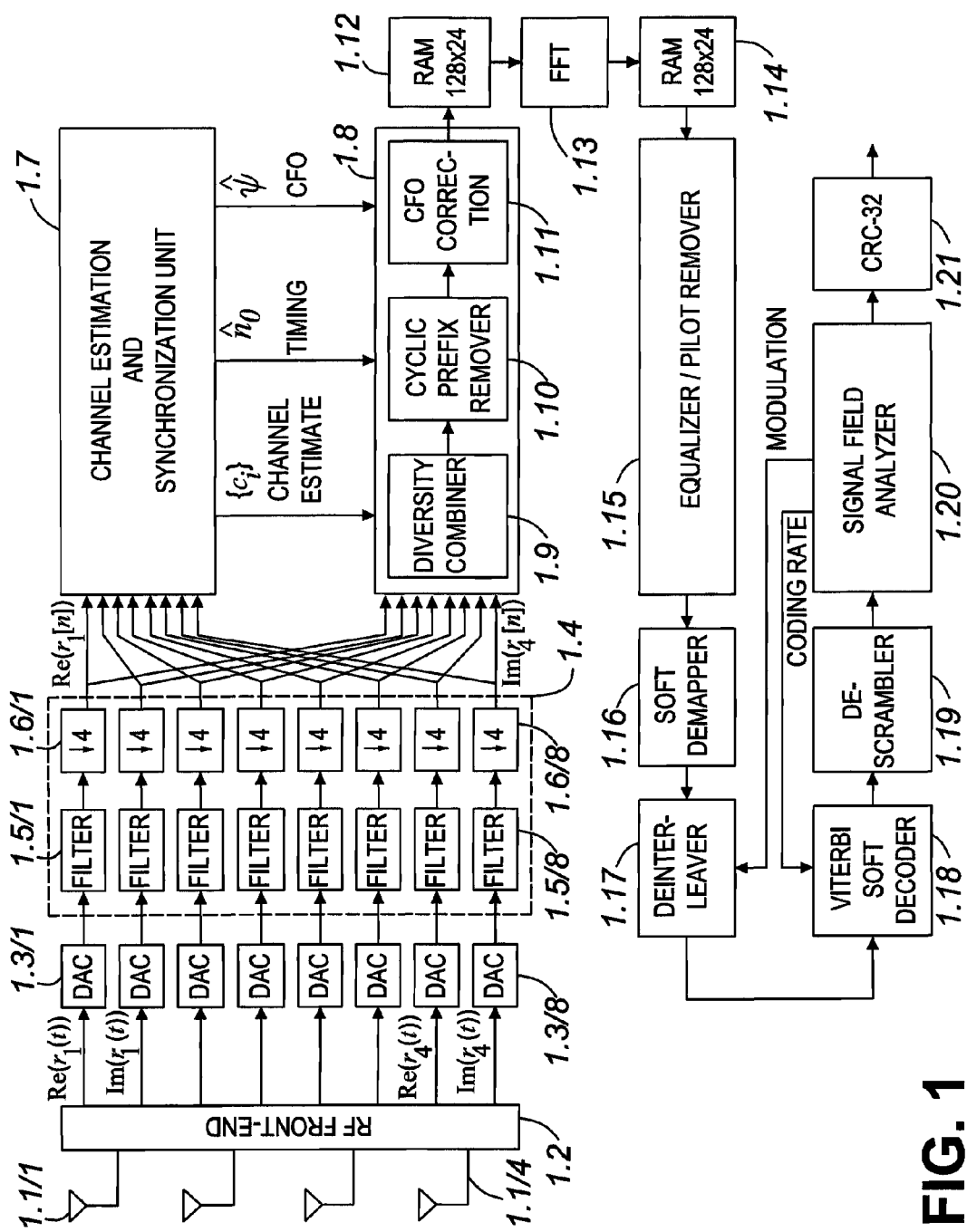
FIG. 1 illustrates the structure of an OFDM receiver for processing received signals from an array antenna to provide synchronization, CFO compensation, and channel estimation for diversity combining.

FIG. 1 illustrates a type of OFDM receiver tailored to the reception of OFDM packets compliant with the IEEE 802.11 standard and featuring diversity combining exploiting an array antenna comprising 4 elements 1.1/1 through 1.1/4. Signals received on these antenna elements are processed firstly by an RF front-end (1.2) which, for each antenna element, performs standard receiver chain operations such as filtering, channel selection, and downconverting. The selected 20 MHz-wide channel is brought to baseband, so that the RF front-end must separately output inline (real) and quadrature (imaginary) components for each antenna element. For each antenna element, this is analytically represented by a single complex baseband signal r_i(t), where i is the index of the element.

The 8 component signals are then routed to a bank of digital-to-analog converters (1.3/1 through 1.3/8) where they are sampled at a rate of 80 MHz. Digital matched filters 1.5/1 through 1.5/8 are then applied to reject out-of-band noise, followed downsamplers 1.6/1 through 1.6/8 which bring the effective sample rate to 20 MHz. The eight resulting signals are then routed to channel estimation and synchronization unit 1.7, which performs preliminary acquisition functions at the start of a received packet and constitutes the object of the present invention. This unit will detect the presence of a packet, determine with precision the start of its payload (this time reference being required among others by cyclic prefix remover 1.10), compute channel estimates for each antenna element (required for diversity combining in unit 1.9), and estimate the carrier frequency offset which will drive the CFO correction unit 1.11.

Other parts of the receiver are generally known to those skilled in this art and so will be itemized briefly here. Thus, such parts comprise RAM buffers 1.12 and 1.14, FFT unit 133, equalizer 1.15 (which also performs pilot tone removal), a series of units handling error-correction code decoding including a soft demapper 1.16, deinterleaver 1.17, and Viterbi soft decoder 1.18. Finally, the signal moves through a descrambler 1.19, analysis of the SIGNAL field in unit 1.20 to determine the modulation type and code rate used for the payload of the packet, and a cyclic redundancy code (CRC) check in unit 1.21 before moving on to the Medium Access Control (MAC) layer.

Operation of the receiver will now be described with reference to FIG. 5, in which step 5.1 denotes filtering using the digital filter matched to the SSTS. However, the set of 16 taps describing each period of the SSTS in the filter is rotated by one position. Indeed, the discrete filter sequence p[n] is given by $$p[n] = \begin{cases} f_p[n+1], & n \in [D, 14], \\ f_p[0], & n = 15, \\ 0, & \text{elsewhere.} \end{cases}$$

This rotation is motivated by the fact that the specific structure of the SSTS is such that an artifact appears in a filter matched to its entire length.

As a result of that artifact, rotating the matched filter will affect the behavior of the system. Using the relative instantaneous power of the main impulse relative to the next as a metric, one can find that rotating the filter by a single tap will optimize the system.

Figure 4:
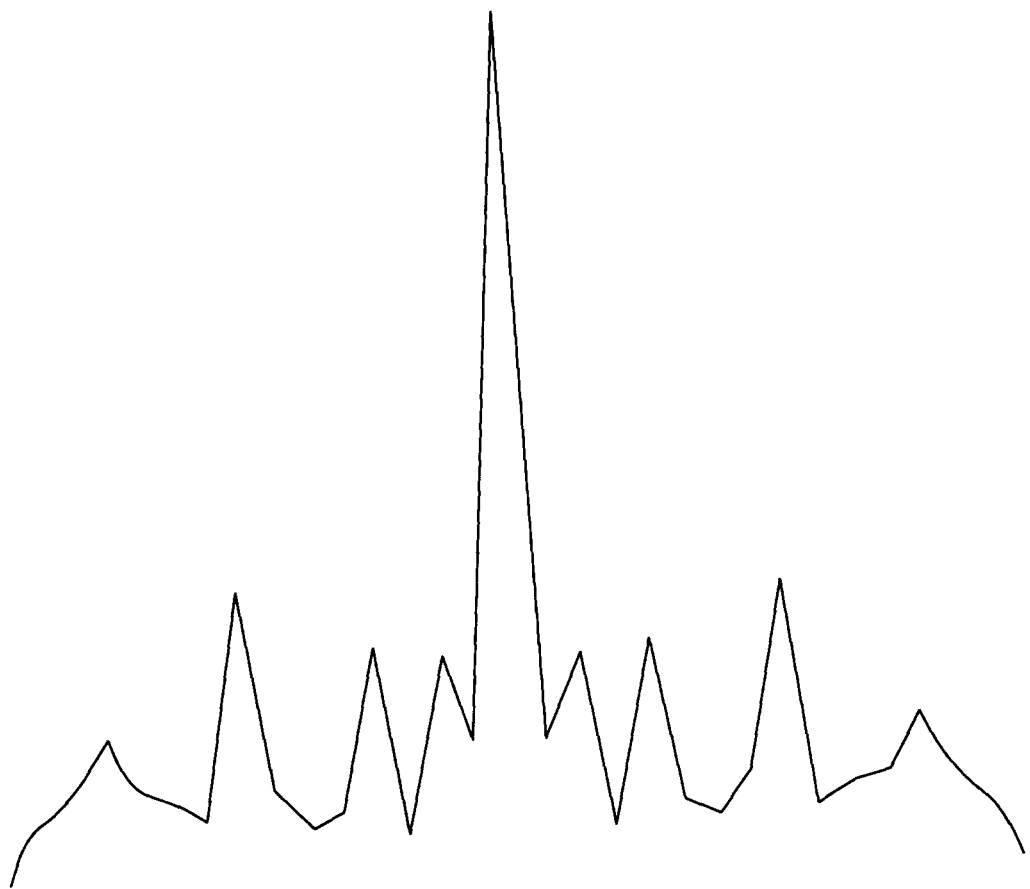
FIG. 4 is the convolution of a period of the short sequence with required filter.

Rotating the full filter is in fact equivalent to rotating each period fp[n] of the full filter. When convoluted with a period of the transmitted short sequence, fp[n] rotated by a single tap will generate a perfectly symmetric response as illustrated by FIG. 4.

The resulting signal will be convolved with an increasing then decreasing Dime comb, generating the impulse sequence depicted by FIG. 3.

Unless the impulse generated by convolving p[n] with $f_p[n]$ is perfectly centered (preceded and followed by 15 samples), the convolution will spread the main impulse over adjacent impulses and vice-versa, thus affecting the discrimination of the main impulse relative to its neighbors while affecting the relative channel estimates in the presence of a CFO. Hence, the rotation by one tap avoids this detrimental situation.

It is precisely such a rotated filter that is employed in step 5.1. The signal y(t), used for time synchronization through space-time processing, is first initialized in 5.2, A loop, starting at 5.4, whose index a is initialized in 5.3, then iterates through all the antennas to compute potential channel estimates at step 5.4 while updating y(t) at step 5. Steps 5.6 and 5.7 are then used for loop control.

Time synchronisation is performed at step 5.8 by isolating the highest impulse. Once a timing estimate is acquired, both the CFO and the narrowband band channel coefficients can be estimated through a loop controlled by steps 5.10, 5.13 and 5.14 where index a iterates through all antennas.

The estimated CFO $\bar{\psi}$ is computed at steps 5.11 and 5.15 using the timing estimate $\bar{n}$ while a narrow-band channel estimate $\hat{c}_i$ on each antenna i is also obtained using the timing estimate $\hat{n}$.

Figure 5:
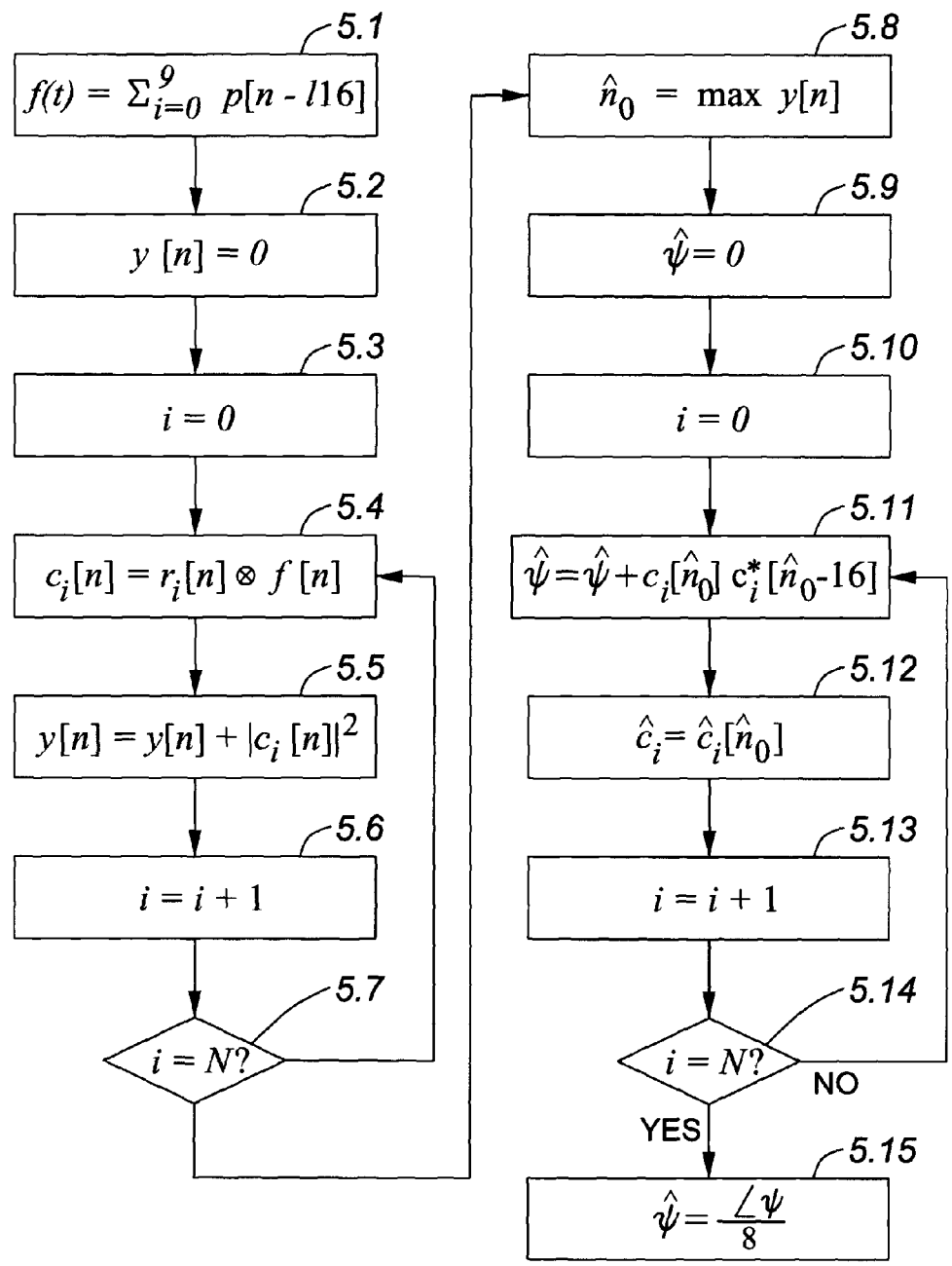
FIG. 5 presents the flowchart describing the first preferred embodiment.

A straightforward hardware implementation of the algorithm defined in FIG. 5 is not ideal for a low complexity real-time implementation. The algorithm would require a large (160 taps) FIR filter, A much simpler filter structure is presented here, exploiting the periodic nature of the SSTS.

Figure 6:
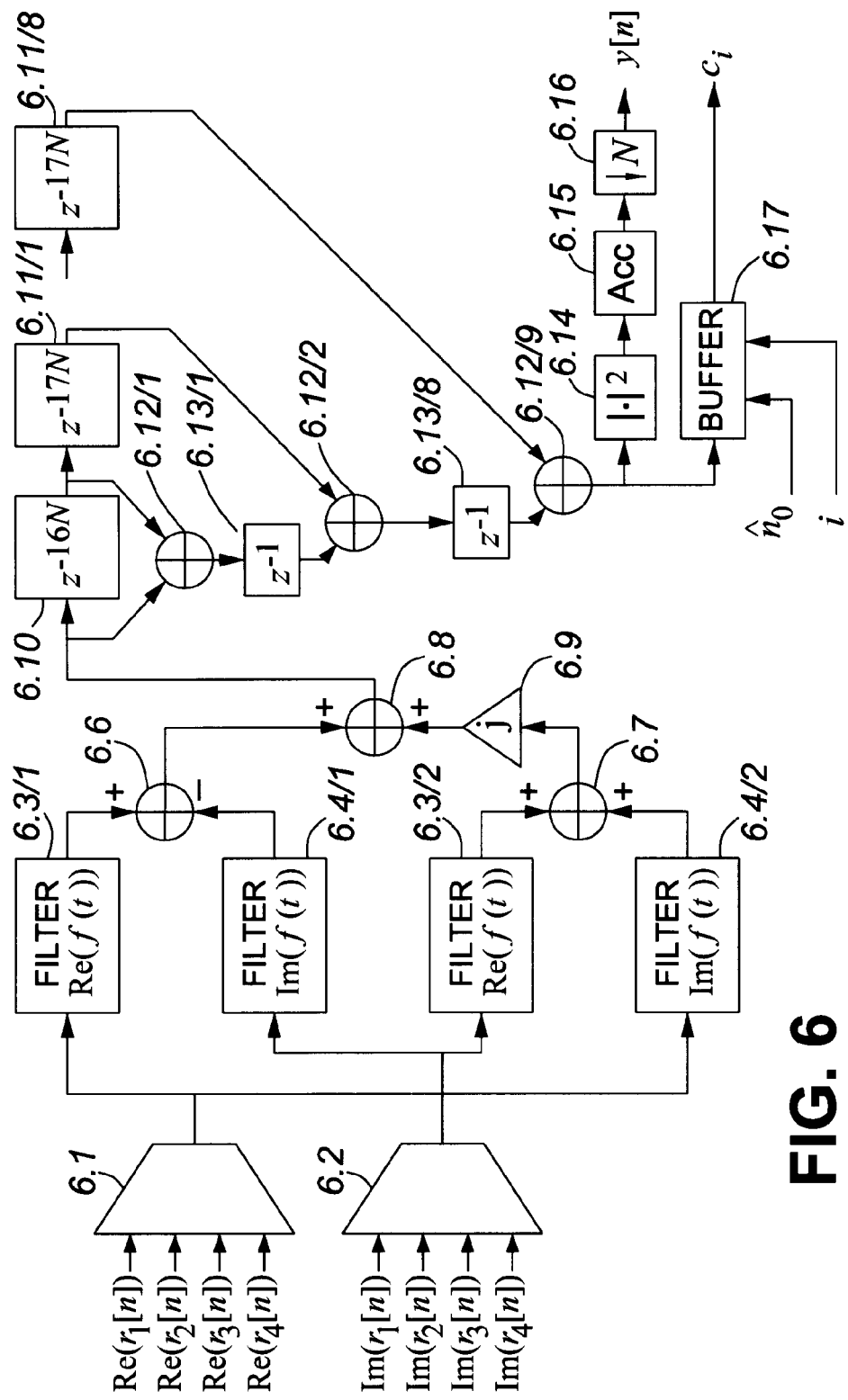
FIG. 6 presents the architecture of the first preferred embodiment.

FIG. 6 presents the main hardware architecture of the channel estimation and synchronization unit 1.7 of FIG. 1. Multiplexers 6.1 and 6.2 act as parallel-to-serial converters, selecting respectively the inline (in-phase) (I) and quadrature (Q) components of the signals $r_I[n] \ldots r_N[n]$, received in parallel on N antennas.

A complex convolution with 6.3 and 6.4, respectively, the real and imaginary parts of samples 2 to 17 of the short preamble, is then performed according to $$r_i[n] \otimes f(t) = [Re(r_i[n]) \otimes Re(f(t)) - Im(r_i[n]) \otimes Im(f(t))] + j[Re(r_i[n]) \otimes Im(f(t)) + Im(r_i[n]) \otimes Re(f(t))]$$

where Re(•) denotes the real part and Im(•) denotes the imaginary part. The complex convolution is thus broken down so that it can be performed through standard convolution operators within real filtering blocks 6.3/1, 6.4/1, 6.3/2 and 6.4/2 and addition/substraction operators (component 6.6/6.7). Real and imaginary parts of the result are then combined through operators 6.8 and 6.9.

The resulting complex signals on each antenna are then presented serially to a combination of delays (components 6.10 and 6.11) and sums (component 6.12). The delay/sum structure exploits the periodicity of the short training sequence to reproduce the behaviour of a filter matching 10 periods of the short sequence, thus reducing considerably the length of the FIR filters. A pipelining latch stage (component 6.13) is added at each addition stage to reduce the combinational path of the circuit. As a result, a single pipeline stage is also added on each delay (component 6.11), thus increasing the said delays by one.

The resulting potential channel estimates on each antenna are then saved in a buffer (component 6.17) to be fetched later when the timing estimate h is available. Said timing estimate h is obtained from itself obtained by summing the squared magnitude (component 6.14) of the serially provided channel estimates via an accumulator (component 6.15), the latter being cleared every N clock cycles, as well as a decimator (component 6.16).

Second Preferred Embodiment

In the first preferred embodiment, step 5.8 supposes that the algorithm is applied on a given time window within which the receiver has knowledge that one and exactly one frame has been transmitted. In other words, some sort of previous coarse timing estimate is assumed.

It may be desirable, in practice, to rely on a threshold mechanism to detect the presence of a frame before searching for a maximum within a specified time window. Such threshold and window values are presented here in the context of a second preferred embodiment which uses the basic hardware filter structure shown in FIG. 6, but with some hardware improvements as shown in FIG. 7, and operation differently, as illustrated by the different flow chart shown in FIG. 8.

Figure 7:
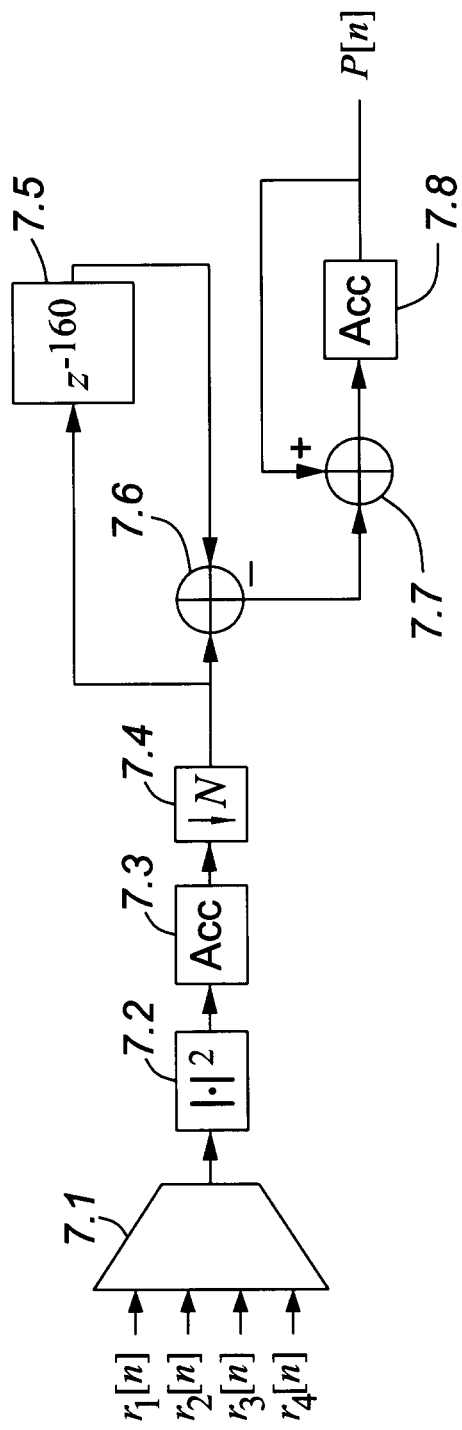
FIG. 7 presents the architecture of the unit used to compute the average power of the signal received over the last 160 samples.

As depicted by FIG. 7, a second structure is used to compute the average power on the N received signals over the last 160 samples (being the length of the equivalent filter corresponding to the structure depicted by FIG. 6). As is the case with FIG. 6, the N parallel received signals are processed serially through the use of a multiplexer (component 7.1).

The instantaneous power on each antenna is then computed by 7.2 before being summed on all antennas via accumulator 7.3 (the latter being cleared every N clock cycles) as well as decimator 7.4. A moving average is then computed over the last 160 samples, simply by subtracting (component 7.6) instantaneous power delayed by 160N samples (7.5) from the current instantaneous power. The resulting quantity is then summed through accumulator 7.7.

Figure 8:
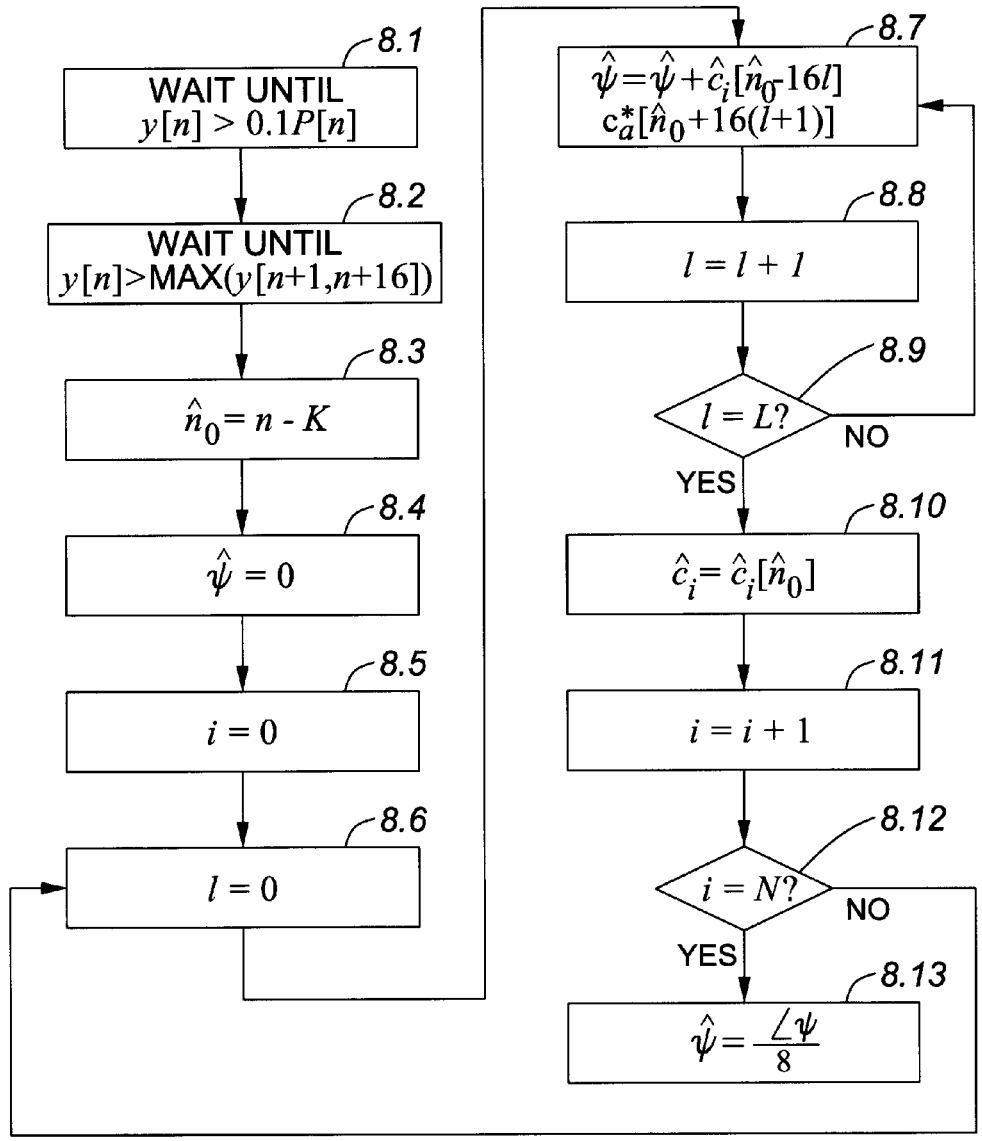
FIG. 8 presents the algorithm of the preferred embodiment.

The average power is used to normalized y[n] within the algorithm depicted by FIG. 8. As mentioned earlier, a real-time operating synchronizer should detect the presence of a frame via a threshold. Empirically, it was verified that a frame can be detected by verifying the following criterion:

$$\frac{y[n]}{p[n]} > 0.1$$

$$y[n] > 0.1 p[n]$$

without noticeable degradation of the performance of the system with respect to the generic algorithm. This criterion is checked at step 8.1. Once it is satisfied, 8.2 searches for a maximum within a window of 16 samples. If the current value of y[n] exceeds the maximum value of the next 16 samples, i.e. the current impulse is higher than the next, a tentative timing estimation is performed based on the position of the current impulse following 8.3. Once again, it was verified empirically that a window of 16 samples is enough to search for a maximum without noticeable degradation of the performance of the system.

Steps 8.4, 8.5, 8.10, 8.11, 8.12 and 8.13 simply reproduce steps 5.9 to 5.15 from FIG. 5 with the exception of the insertion of a new loop improving the CFO estimation.

Loop iterator l, initialized at step 8.6, iterates through L pairs of consecutive impulses (steps 8.8 and 8.9) to compute the angle difference in each pair at step 8.7 in order to improve the immunity of the CFO estimation to Gaussian noise. The more impulse pairs are used, the more immune is the CFO estimate to Gaussian noise. Moreover, the angle differences are averaged in the same fashion as are the ones provided by different antennas, thus associating a proper level of confidence to the information provided by each pair (maximum-ratio principle).

The further a given pair is located from the main impulse, the lower will be the level of confidence associated with the information given by that pair. As a result, it was verified empirically that no significant incremental improvement is gained beyond four pairs (L=4).

Third Preferred Embodiment

As the RMS delay spread of the channel increases, the PER increases since less energy is received through the channel associated with the narrow-band channel estimate. Indeed, as the length of the channel impulse response increases, the channel behavior becomes more frequency-selective, making the narrow-band channel estimate less suitable for space-time processing. Over a highly spreading channel, a third embodiment of the present invention can provide a wideband channel estimate. Indeed, through linearity, the main impulse is closely matched to the channel impulse response.

Figure 9:
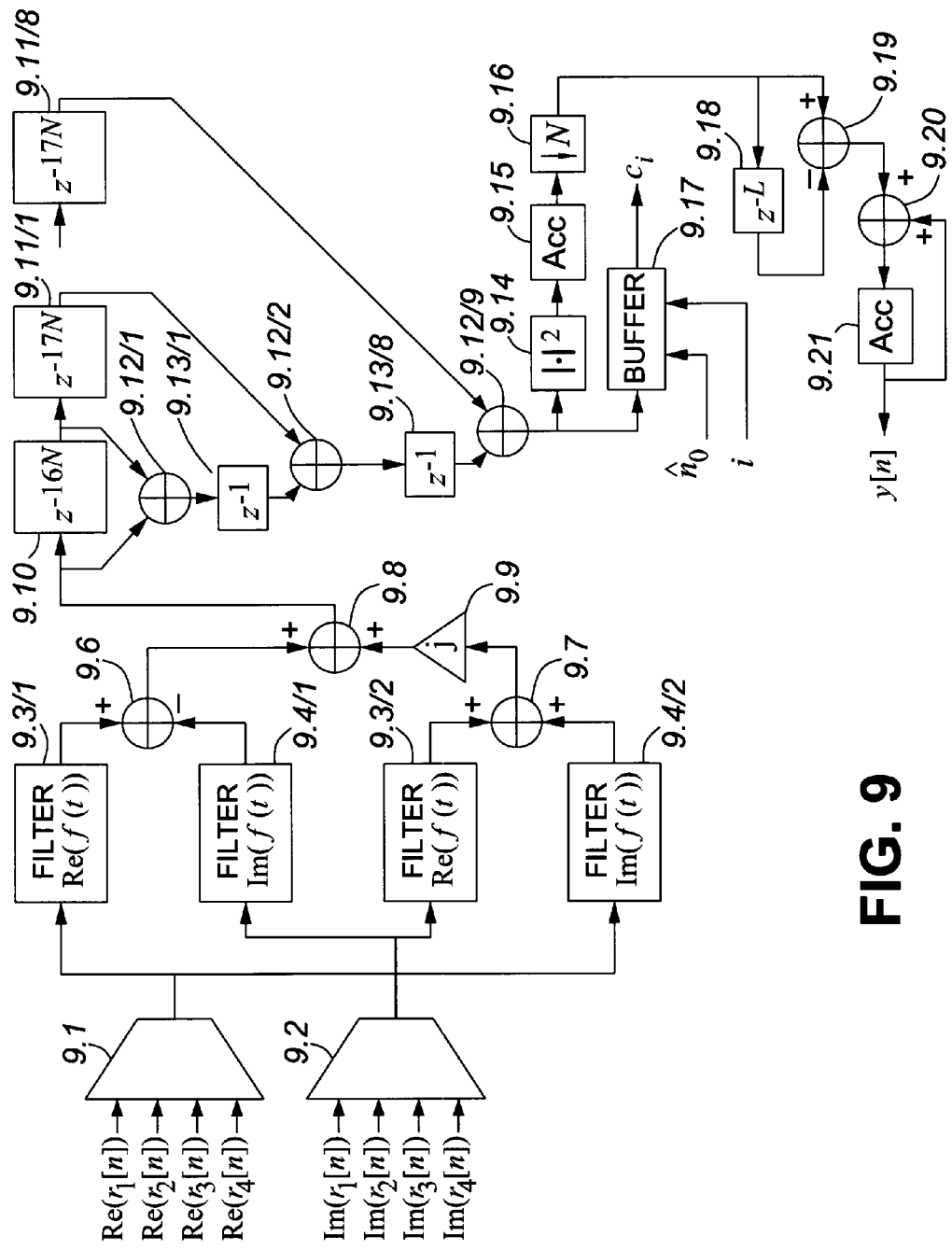
FIG. 9 presents the architecture of the second embodiment.

The channel estimate becomes less reliable as samples are taken farther away from the peak of the impulse response due to both the Dirac delta function approximation as well as to the deteriorating immunity to Gaussian noise as the magnitude of the channel estimation decreases. As a result, the length of the channel impulse response is considered to be a few samples long providing a reliable channel estimate still suitable even under a highly spreading channel. The time synchronization algorithm must be adapted to suit the dispersive nature of the channel. In order to so, a moving average matching the length L of the channel impulse response is applied at the output y[n] in FIG. 9 through components 9.18 trough 9.21, while components 9.1 through 9.17 are basically identical to components 5.1 through 5.17.

Figure 10:
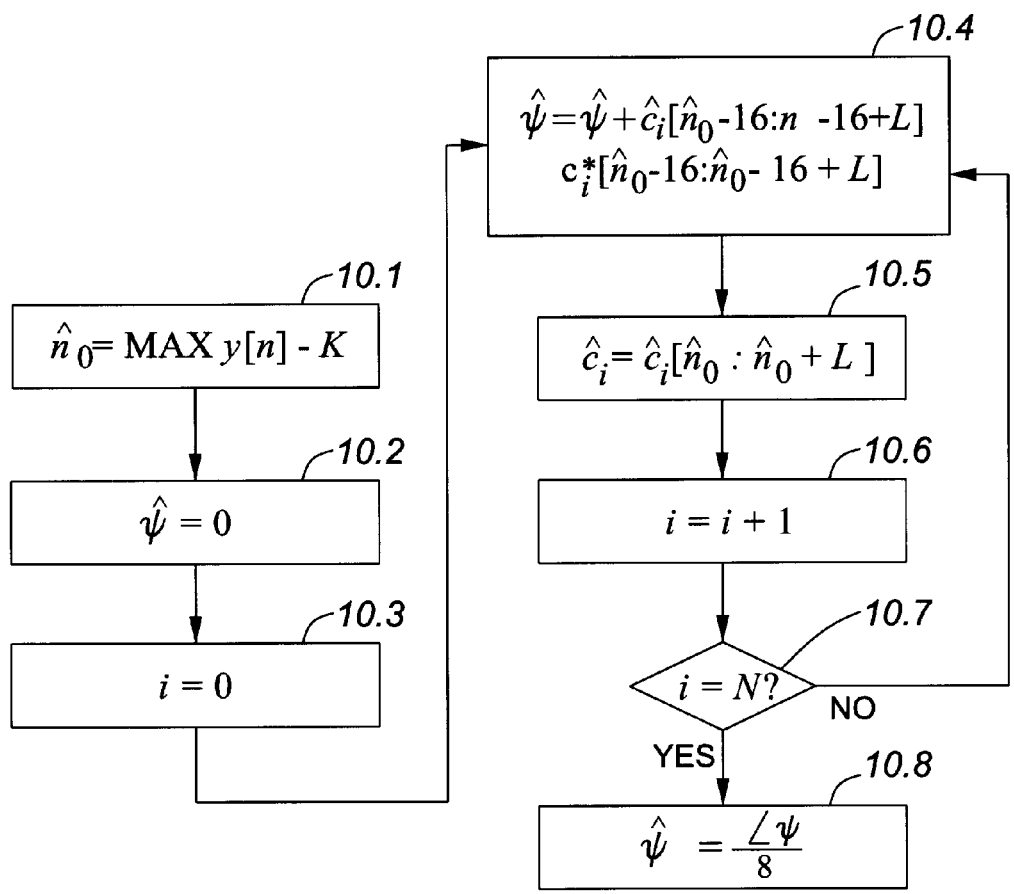
FIG. 10 presents the algorithm of the second embodiment

The main algorithm must also be adapted not only to provide a wideband channel estimate, but also to take advantage of such a channel estimate to compute the CFO as illustrated by FIG. 10. In a fashion similar to that shown in FIG. 5, the algorithm searches for the main peak in step FIG. 10.1 only this time using the signal averaged over L samples. This mechanism ensures that the time synchronization is performed in order to maximize the received energy with respect to the wideband channel estimate.

The CFO estimation can also be improved by exploiting the wideband channel estimate as shown in step 10.4. Rather than using the complex conjugate of the previous peak matching the narrowband channel estimate as is the case in 5.11, the full impulse response of the channel estimate is exploited using its Hermitian transpose rather than its complex conjugate.

The wideband channel estimate itself in then acquired in 10.5, while steps 10.2 and 10.3 as well as 10.6 through 10.8 simply reproduce steps 5.9 and 5.3 as well as 5.13 through 5.15. The wideband channel estimate can then be used downstream, usually through post-FET space-time processing.

Benefits of Embodiments of the Invention

Figure 11:
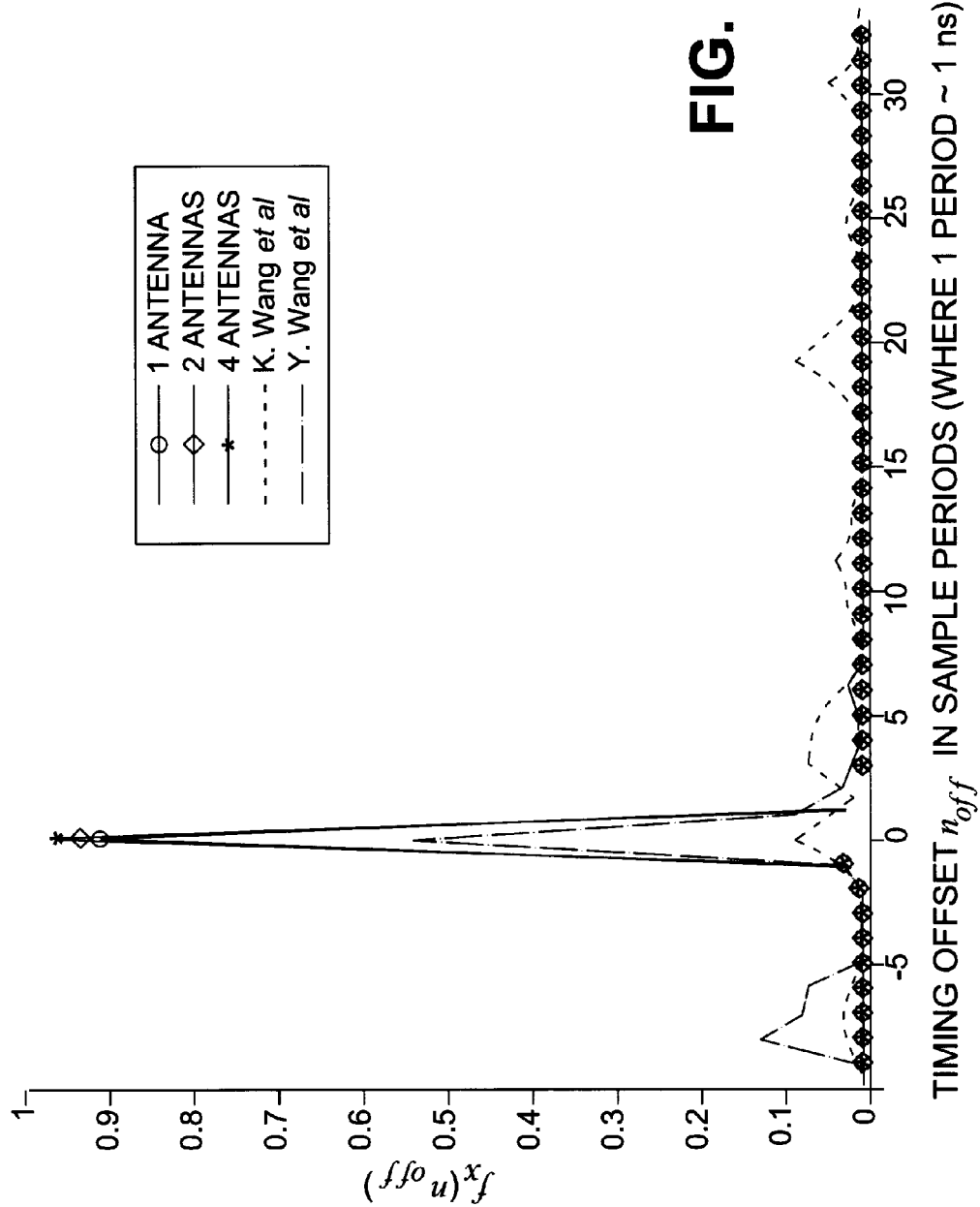
FIG. 11 is the probability distribution of the timing estimate offset using a Rayleigh-fading dispersive channel with an RMS delay spread of 100 ns, Eb N0=14 dB and an uniformly distributed CFO between ±232 kHz.

FIG. 11 compares the probability distribution of timing estimation for the scheme developed here using up to four antennas with hardware-oriented algorithms presented in the literature. An AWGN Rayleigh-fading dispersive channel was assumed for simulation.

Figure 12:
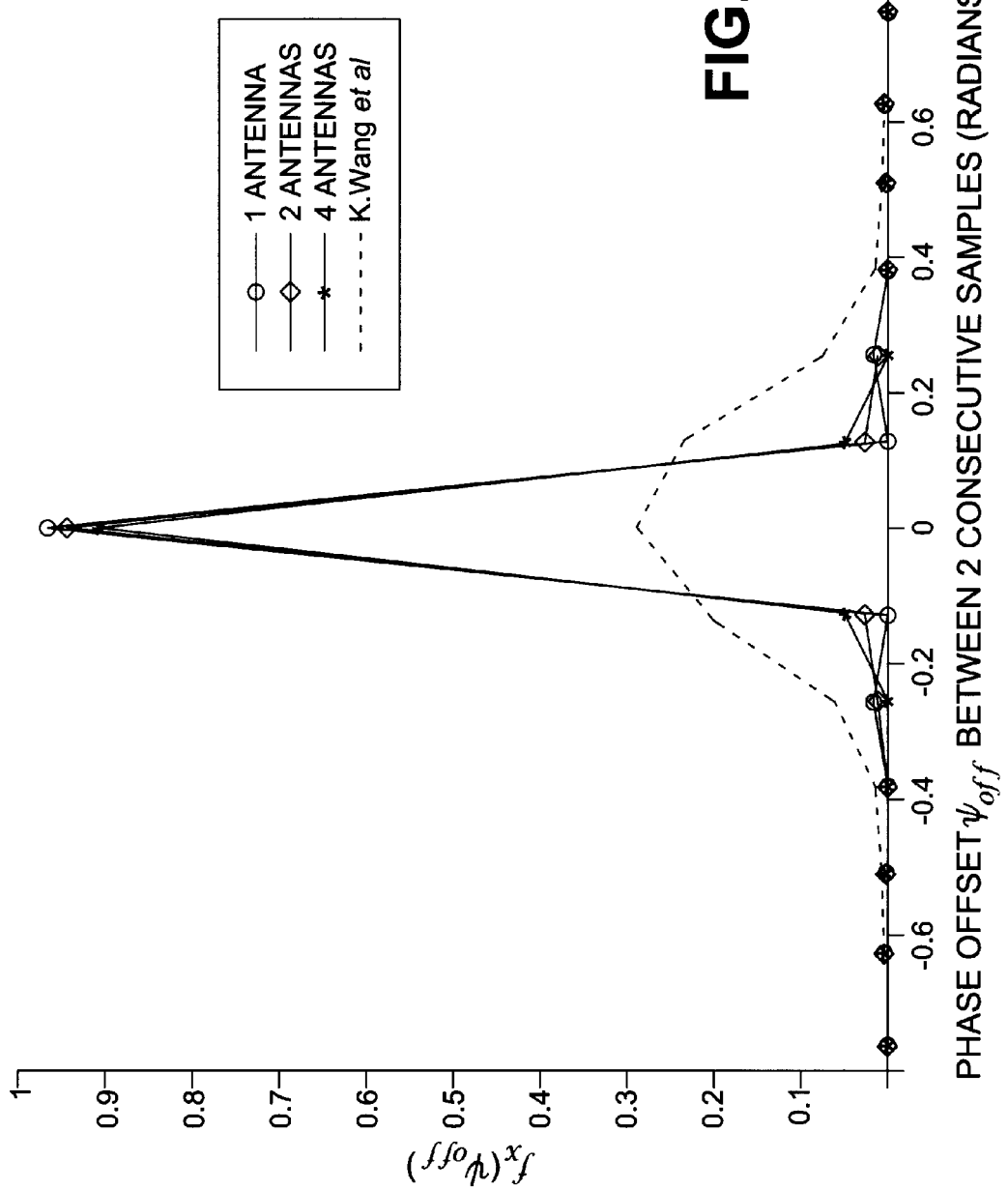
FIG. 12 is the Probability distribution of the CFO estimate offset using a Rayleigh channel with an RMS delay spread of 100 ns, Eb N0=14 dB and a uniformly distributed CFO between ±232 kHz.

It should be noted that the algorithm presented in Yong Wang, Ge Jinn-hua, Bo Ai and Li Zong-Qiang "A Novel Scheme for Symbol Timing in OFDM WLAN Systems" in IEEE International Symposium on Communications and Information Technology was modified because as originally described, it demonstrated poor performance in simulations. Is has been assumed that a perfect 16-samples-wide coarse timing estimate was provided. Such a coarse timing estimate can be obtained from the autocorrelation function of the received signal evaluated at r=16 in the physical system. The scheme presented by K. Wang, J. Singh and M. Faulkner "FPGA Implementation of an OFDM-WLAN Synchronizer" in IEEE International Workshop on Electronic Design, Test and Applications based on the auto-correlation function, was also used for comparison. Embodiments of the present invention clearly outperformed both. The second scheme was also used for comparison of the CFO estimate precision using up to four antennas (see FIG. 12) Once again, the scheme presented here demonstrated much better performance, regardless of the number of antennas used.

Figure 13:
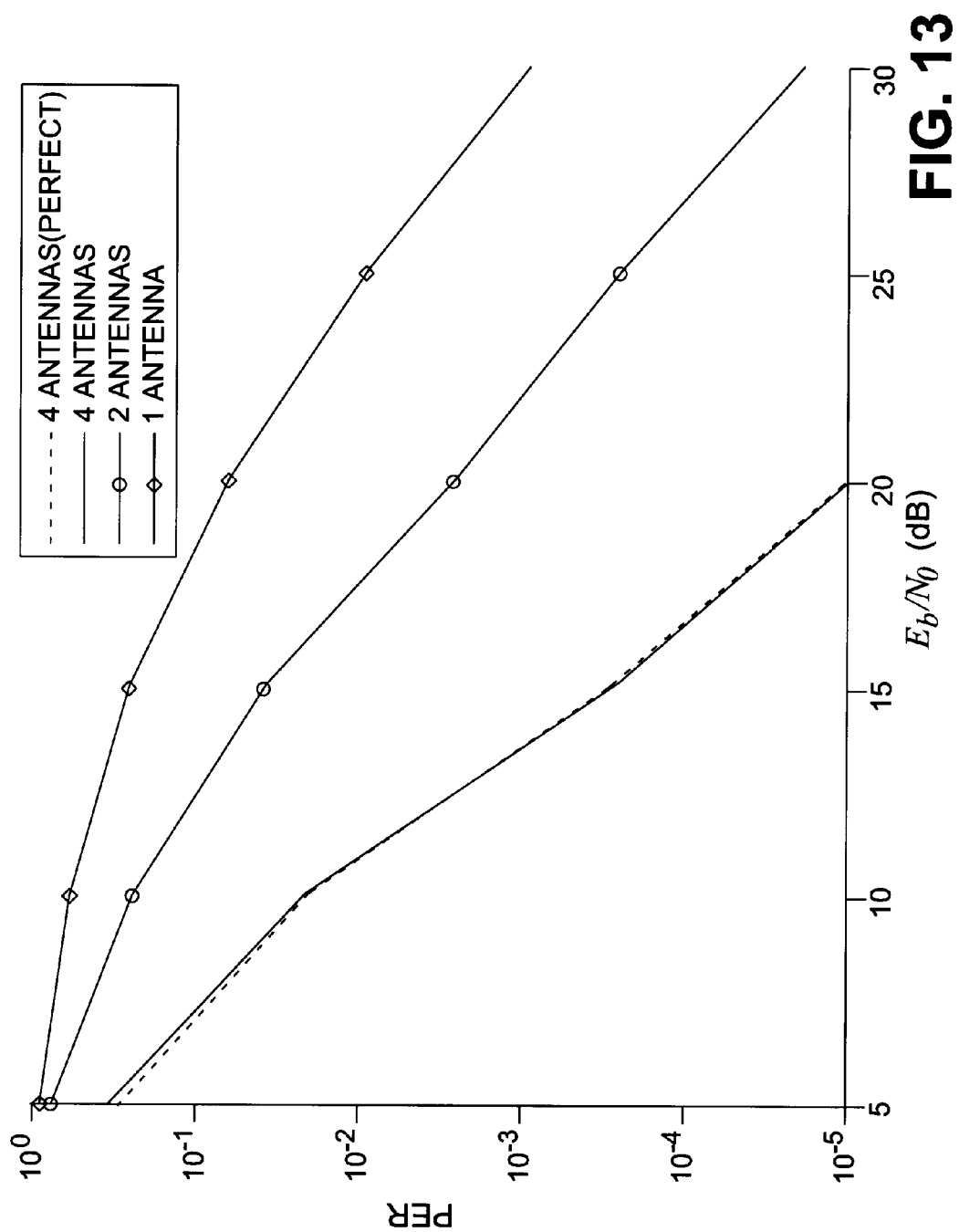
FIG. 13 is the Packet Error Rate vs Eb N0 with an RMS delay spread of 100 ns and an uniformly distributed CFO between ±232 kHz for a 77 bytes long packet.

In order to demonstrate the efficiency of the channel estimation, the Packet Error Rate PER of a complete reception chain was computed for one to four antennas inclusively (see FIG. 13). The signals received on each antenna where combined according to the maximum ratio combining principle exploiting the channel estimate provided by the present invention. As illustrated, the design takes advantage of spatial diversity to significantly improve the performance of the system as the number of antennas increases.

The design was also tested with 4 antennas assuming perfect knowledge of the narrow band channel, the position of the first sample and the CFO without any visible improvements over the non-idealized system. This implies that embodiments of the invention are relatively insensitive to channel estimation errors up to a point.

It should be appreciated that the signal acquisition process employed in the above-described preferred embodiments of the invention could be implemented using hardware, software or a combination of the two.

For supplemental information about embodiments of the present invention, the reader is directed to the article "An end-to-end prototyping framework for compliant wireless LAN transceivers with smart antennas", Sébastien Roy et al., Computer Communications 31 (2008), 1551-1563, the entire contents of which are incorporated herein by reference.

INDUSTRIAL APPLICABILITY

Preferred OFDM receivers embodying the present invention obtain synchronization based on the cross-correlation technique and optionally exploit spatial diversity. They may also provide narrowband channel estimates for each antenna, making them especially suitable for antenna array applications, though the invention is also applicable to single antenna receivers. By exploiting the periodicity of the short preamble (herein termed short symbol training sequence or SSTS), the FIR filter structure implementing the cross-correlation can serve as the basis for a hardware-efficient system capable of simultaneously and jointly deriving time synchronization, carrier frequency offset estimate, and/or narrowband channel estimates. All of these tasks are performed on the fly with minimal latency and require only usage of the SSTS, leaving free the subsequent long symbol training sequence (LSTS, as found in 802.11a and 802.11 g standards) for other uses.

Many advantages derive from performing at least two and preferably all three operations jointly, in terms of latency, hardware complexity, and length of training sequence required to achieve satisfactory convergence on all counts. The periodicity of the training sequence is exploited to reduce considerably the main filter complexity and optionally dynamically adjust carrier offset compensation throughout the filtering process, thus improving the quality of all final estimates (carrier frequency offset, time synchronization, and channel).

The invention claimed is:

1. A method of signal acquisition in a communications receiver for receiving Orthogonal Frequency Division Multiplex (OFDM) signals comprising data packets each comprising a preamble training sequence having a periodic structure, the method comprising the steps of:
    (i) sampling a received OFDM signal to obtain received-signal samples;
    (ii) filtering said samples using a matched finite impulse response (FIR) filter having an impulse response matched to said periodic structure of said preamble training sequence;
    (iii) detecting occurrence of one or several peaks, the highest peak representing a maximum amplitude, of the cross-correlation output from said FIR over a predetermined number of periods corresponding to at least part of said preamble training sequence; and
    (iv) using one or more of timing, magnitude and phase of said maximum amplitude, to determine one or more of time synchronization, carrier frequency offset and channel estimation.

2. A method according to claim 1, wherein step (iv) detects a maximum amplitude of the cross-correlation output from said FIR and provides the timing of said maximum amplitude relative to said predetermined period as a timing reference for demodulation of said received data.

3. A method according to claim 1, in a said receiver having an array antenna comprising a plurality of antenna elements for receiving a plurality of individual said received signals, respectively, wherein
    step (iv) determines for each antenna element, a channel estimate as the magnitude and phase of said maximum amplitude of the corresponding individual received signal and uses said magnitude and phase to weight corresponding data for that antenna element in a subsequent step of combining the individual received-signals of the antenna elements, respectively.

4. A method according claim 1, further comprising the step of determining and dynamically adjusting a phase offset from successive peaks at the output of said filter for dynamically correcting carrier frequency offset and applying the inverse of said phase offset to the input of said matched filter for use in filtering subsequent ones of said preamble samples.

5. A method according to claim 1, wherein:
step (iii) comprises the steps of
(iii)(a) detecting a series of peaks at the output of said filter, each peak corresponding to one received short OFDM symbol; and
step (iv) comprises the steps of
(iv)(a) extracting the phase difference between two of said peaks,
(iv)(b) calculating from said phase difference the phase shift induced per sample by the carrier frequency offset, said phase difference being a multiple of said phase shift with the factor between the two being determined by the separation of the two peaks;
the method further comprising the step of:
(v) using said phase shift to correct for said carrier frequency offset, preferably after multiplying the said received signal by a unit coefficient with the inverse phase shift.

6. A method according to claim 1, wherein:
step (iii) comprises the steps of
(iii)(a) detecting a series of peaks at the output of said filter, each peak corresponding to one received short OFDM symbol; and
step (iv) comprises the steps of
(iv)(a) extracting the phase difference between two of said peaks,
(iv)(b) calculating from said phase difference the phase shift induced per sample by the carrier frequency offset, said phase difference being a multiple of said phase shift with the multiplication factor between the two being determined by the separation of the two peaks; and
(iv)(c) determining the timing of said maximum amplitude relative to said predetermined number of periods,
and the method further comprises the steps of:
(v) using said phase shift to correct for said carrier frequency offset, and
(vi) providing the timing of said maximum amplitude as a timing reference for demodulation of said received data.

7. A method according to claim 1, in a said receiver having an array antenna comprising a plurality of antenna elements for receiving a plurality of individual said received signals, respectively, wherein:
step (iv) comprises the steps of
for each antenna element, determining magnitude and phase of said maximum amplitude of the corresponding individual received signal;
and determining the timing of said maximum amplitude on any given antenna, or any combined signal created by combining the filter outputs at all antennas, as a timing reference for demodulation of said received data; and
the method further comprises the steps of
providing the timing of said maximum amplitude as a timing reference for demodulation of said received data; and
using said magnitude and phase to weight corresponding data for that antenna element in a subsequent step of combining the individual received-signals of the antenna elements, respectively.

8. A method according to claim 1, wherein said number of periods begins when the detected energy of the received signal samples in a period exceeds a prescribed threshold level.

9. A method according to claim 1, wherein step (iv) determines said one or more of time synchronization, carrier frequency and channel estimation using other FIR output peaks in addition to said maximum amplitude.

10. A method of signal acquisition in an OFDM radio receiver having an array antenna comprising a plurality of antenna elements each for receiving an individual received signal comprising data packets each comprising a preamble training sequence having a periodic structure, the method comprising the steps of:
for each antenna element:
(i) sampling its received individual radio signal to obtain a series of received-signal samples;
(ii) filtering said samples using a matched finite impulse response (FIR) filter having an impulse response matched to said periodic structure of said preamble training sequence;
(iii) detecting a series of peaks at the output of said filter, each peak corresponding to one received OFDM symbol of the preamble training sequence;
(iv) detecting a maximum amplitude of the cross-correlation output among said peaks from said FIR; and
(v) determining a channel estimate (CE) as the magnitude and phase of said maximum amplitude; and
(vi) using said magnitude and phase to weight corresponding data for that antenna element in a subsequent step of combining the individual received-signals of the antenna elements, respectively;
(vii)(a) extracting the phase difference between two of said peaks,
(vii)(b) calculating from said phase difference the phase shift induced per sample by carrier frequency offset, said phase difference being a multiple of said phase shift with the multiplication factor between the two being determined by the separation of the two peaks;
(viii) adjusting each phase shift estimate by adding such estimates for all antenna elements, each being previously weighted by the corresponding channel magnitude determined in step (v);
(ix) the adjusted phase shift estimate being used for carrier offset correction during subsequent processing steps, preferably after multiplying a signal sample by a complex coefficient of unit magnitude which is the inverse of said phase shift.

11. A method of signal acquisition in an OFDM radio receiver having an array antenna comprising a plurality of antenna elements each for receiving an individual received signal comprising data packets each comprising a preamble training sequence having a periodic structure, the method comprising the steps of:
for each antenna element:
(i) sampling its individual received signal to obtain a series of received-signal samples;
(ii) filtering the preamble samples using a matched finite impulse response (FIR) filter having an impulse response matched to said periodic structure of said preamble training sequence;
(iii) detecting a series of peaks at the output of said filter, each peak corresponding to one received OFDM symbol of the preamble training sequence;
(iv) detecting a maximum amplitude of the cross-correlation output among said peaks from said FIR; and (v) providing the timing of said maximum amplitude on any given antenna, or any combined signal created by combining the filter outputs at all antennas, as a timing reference for demodulation of said received data;

(vi) determining magnitude and phase of said maximum amplitude; and (vii) using said magnitude and phase to weight corresponding data for that antenna element in a subsequent step of combining the individual received-signals of the antenna elements, respectively;

(viii)(a) extracting the phase difference between two peaks, where said two peaks can be two consecutive peaks or can be more widely separated;

(viii)(b) calculating from said phase difference the phase shift induced per sample by the carrier frequency offset, said phase difference being a multiple of said phase shift with the factor between the two being determined by the separation of the two peaks;

(ix) adjusting a phase shift estimate by adding such estimate for all antennas, each being previously weighted by the corresponding channel magnitude determined in step (vi); and (x) the adjusted phase shift estimate being used for carrier offset correction during subsequent processing steps, preferably after multiplying a signal sample by a complex coefficient of unit magnitude which is the inverse of said phase shift.

12. A method of signal acquisition in an OFDM (Orthogonal Frequency Domain Multiplexed) receiver for receiving received signals comprising data packets each comprising a preamble training sequence having a periodic structure, comprising the steps of:

(i) sampling a received OFDM radio signal to obtain a series of received-signal samples;

(ii) filtering the preamble samples using a matched finite impulse response (FIR) filter having an impulse response matched to said periodic structure of said preamble training sequence, said filtering being preceded by a complex multiplication by a correction coefficient for dynamic carrier frequency offset compensation, said coefficient being initially equal to 1;

(iii) detecting the first two peaks at the output of said filter, each peak corresponding to one received short OFDM symbol;

(iv)(a) extracting the phase difference between said two peaks;

(iv)(b) calculating from said phase difference the phase shift induced per sample by the carrier frequency offset, said phase difference being a multiple of said phase shift with the factor between the two being determined by the separation of the two peaks;

(v) multiplying the correction coefficient at the multiplier ahead of the matched filtering by a complex value of unit amplitude whose phase is minus the phase shift found in step (iv);

(vi) pursuant to the filtering step, updating the correction coefficient for every received peak as a function of the last received two peaks according to steps (iii)-(v);

(vii) detecting a maximum amplitude of the cross-correlation output among said peaks from said FIR; and (viii) providing the timing of said maximum amplitude as a timing reference for demodulation of said received data;

(ix) providing the final value of the correction coefficient as a measure of the carrier frequency offset for its compensation in subsequent steps.

13. A method of estimating and correcting carrier frequency offset and estimating from received data in an OFDM radio receiver characteristics of a transmission channel whereby said received data was received, said OFDM radio receiver having an array antenna comprising a plurality of antenna elements each for receiving an individual received signal comprising data packets each comprising a preamble training sequence having a periodic structure, the method comprising the steps of:

for each antenna element:

(i) sampling a received OFDM radio signal to obtain a series of received-signal samples;

(ii) filtering the preamble samples using a matched finite impulse response (FIR) filter having an impulse response matched to said periodic structure of said preamble training sequence, said filter being preceded by a complex multiplication by a correction coefficient for dynamic carrier frequency offset compensation, said correction coefficient being initially equal to 1;

(iii) detecting the first two peaks at the output of said filter, each peak corresponding to one received short OFDM symbol;

(iv) determining magnitude and phase of the maximum amplitude out of the said two peaks, for each antenna, said magnitude and phase constituting the current estimate of the channel coefficient associated with each antenna;

(v)(a) extracting the phase difference between said two peaks on each antenna;

(v)(b) calculating from said phase difference the phase shift induced per sample by the carrier frequency offset, said phase difference being a multiple of said phase shift with the factor between the two being determined by the separation of the two peaks;

(vi) expressing said phase shift on each antenna by a complex coefficient of unit magnitude, computing the weighted normalized sum of all such coefficients for all antennas, where the weight associated with a specific coefficient is proportional to the current channel gain estimate on the same antenna;

(vii) multiplying the correction coefficient at the multiplier ahead of the matched filter by a complex value of unit amplitude whose phase is minus the phase shift found in the normalized sum operation of step (vi);

(viii) pursuant to the filtering operation, updating the current channel estimate and the correction coefficient for every received peak as a function of the last received two peaks according to steps (iii)-(vii)

(ix) detecting a maximum amplitude of the cross-correlation output among said peaks from said FIR; and (x) determining magnitude and phase of said maximum amplitude; and (xi) using said magnitude and phase to weight corresponding data for that antenna element in a subsequent step of combining the individual received-signals of the antenna elements, respectively;

(xii) providing the final value of the correction coefficient as a measure of the carrier frequency offset for compensation thereof in subsequent steps.

14. A method of jointly A—estimating and correcting carrier frequency offset, B—recovering timing (synchronizing) and C—estimating from received data in an OFDM radio receiver characteristics of a transmission channel whereby said received data was received, said OFDM radio receiver having an array antenna comprising a plurality of antenna elements each for receiving an individual received signal comprising data packets each comprising a preamble training sequence having a periodic structure, the method comprising the steps of:

for each antenna element:
(i) sampling its individual received OFDM radio signal to obtain a series of received-signal samples;
(ii) filtering the preamble samples using a matched finite impulse response (FIR) filter having an impulse response matched to said periodic structure of said preamble training sequence, said filtering being preceded by a complex multiplication by a correction coefficient for dynamic carrier frequency offset compensation, said correction coefficient being initially equal to 1;
(iii) detecting the first two peaks at the output of said filter, each peak corresponding to one received OFDM symbol of the training sequence;
(iv) determining magnitude and phase of the maximum amplitude out of the said two peaks, for each antenna, said magnitude and phase constituting the current estimate of the channel coefficient associated with each antenna;
(v)(a) extracting the phase difference between said two peaks on each antenna;
(v)(b) calculating from said phase difference the phase shift induced per sample by the carrier frequency offset, said phase difference being a multiple of said phase shift with the factor between the two being determined by the separation of the two peaks;
(vi) expressing said phase shift on each antenna by a complex coefficient of unit magnitude, computing the weighted normalized sum of all such coefficients for all antennas, where the weight associated with a specific coefficient is proportional to the current channel gain estimate on the same antenna;
(vii) multiplying the correction coefficient at the multiplier ahead of the matched filter by a complex value of unit amplitude whose phase is minus the phase found in the normalized sum operation of step (vi);
(viii) pursuant to the filtering operation, updating the current channel estimate and the correction coefficient for every received peak as a function of the last received two peaks according to steps (iii)-(vii)
(ix) detecting a maximum amplitude of the cross-correlation output among said peaks from said FIR; and
(xi) determining magnitude and phase of said maximum amplitude;
(xii) using said magnitude and phase to weight corresponding data for that antenna element in a subsequent step of combining the individual received-signals of the antenna elements, respectively;
(xiii) providing the timing of said maximum amplitude on any given antenna, or any combined signal created by combining the filter outputs at all antennas, as a timing reference for demodulation of said received data; and
(xiv) providing the final value of the correction coefficient as a measure of the carrier frequency offset for its compensation in subsequent steps.

15. An OFDM receiver for receiving Orthogonal Frequency Division Multiplex (OFDM) signals comprising data packets each comprising a preamble training sequence having a periodic structure, the receiver having signal acquisition means comprising:
(i) means for sampling a received OFDM signal to obtain received-signal samples;
(ii) means for filtering said samples using a matched finite impulse response (FIR) filter having an impulse response matched to said periodic structure of said preamble training sequence;
(iii) means for detecting occurrence of one or several peaks, the highest representing a maximum amplitude, of the cross-correlation output from said FIR over a predetermined number of periods corresponding to at least part of said training sequence; and
(iv) means for using one or more of timing, magnitude and phase of said maximum amplitude, to determine one or more of time synchronization, carrier frequency offset and channel estimation.

16. A receiver according to claim 15, wherein the determining means detects a maximum amplitude of the cross-correlation output from said FIR and provides the timing of said maximum amplitude relative to said predetermined period as a timing reference for demodulation of said received data.

17. A receiver according to claim 15, having an array antenna comprising a plurality of antenna elements for receiving a plurality of individual said received signals, respectively, wherein
the determining means determines for each antenna element, a channel estimate as the magnitude and phase of said maximum amplitude of the corresponding individual received signal,
and the receiver comprises means for using said magnitude and phase to weight corresponding data for that antenna element in a subsequent step of combining the individual received-signals of the antenna elements, respectively.

18. A receiver according to claim 17, further comprising means for determining and dynamically adjusting a phase offset from successive peaks at the output of said filter for dynamically correcting carrier frequency offset and applying the inverse of said phase offset to the input of said matched filter for use in filtering subsequent ones of said preamble samples.

19. A receiver according to claim 15, wherein:
the detecting means is operable to
(iii)(a) detect a series of peaks at the output of said filter, each peak corresponding to one received short OFDM symbol; and
the determining means is operable to
(iv)(a) extract the phase difference between two of said peaks,
(iv)(b) calculate from said phase difference the phase shift induced per sample by the carrier frequency offset, said phase difference being a multiple of said phase shift with the factor between the two being determined by the separation of the two peaks;
the receiver further comprising means for using said phase shift to correct for said carrier frequency offset, the phase shift using means preferably comprising means for multiplying a signal sample by a unit coefficient with the inverse phase shift.

20. A receiver according to claim 15, wherein:
the detecting means is operable to:
(iii)(a) detect a series of peaks at the output of said filter, each peak corresponding to one received short OFDM symbol; and
the determining means is operable to:
(iv)(a) extract the phase difference between two of said peaks,
(iv)(b) calculate from said phase difference the phase shift induced per sample by the carrier frequency offset, said phase difference being a multiple of said phase shift with the multiplication factor between the two being determined by the separation of the two peaks; and (iv)(c) determine the timing of said maximum amplitude relative to said predetermined number of periods, and the receiver further comprises means for using said phase shift to correct for said carrier frequency offset and means for providing the timing of said maximum amplitude as a timing reference for demodulation of said received data.

21. A receiver according to claim 15, having an array antenna comprising a plurality of antenna elements for receiving a plurality of individual said received signals, respectively, wherein:

the determining means comprises, for each antenna element, means for determining magnitude and phase of said maximum amplitude of the corresponding individual received signal; and means for determining the timing of said maximum amplitude on any given antenna, or any combined signal created by combining the filter outputs at all antennas, as a timing reference for demodulation of said received data; and the receiver further comprises means for:

providing the timing of said maximum amplitude as a timing reference for demodulation of said received data; and using said magnitude and phase to weight corresponding data for that antenna element in a subsequent step of combining the individual received-signals of the antenna elements, respectively.

22. A receiver according to claim 15, having an array antenna comprising a plurality of antenna elements for receiving a plurality of individual said received signals, respectively, wherein:

the determining means is operable to determine, for each antenna element, magnitude and phase of said maximum amplitude of the corresponding individual received signal; and the timing of said maximum amplitude on any given antenna, or any combined signal created by combining the filter outputs at all antennas, as a timing reference for demodulation of said received data; and the receiver further comprising means for:

providing the timing of said maximum amplitude as a timing reference for demodulation of said received data; and using said magnitude and phase to weight corresponding data for the corresponding antenna element in a subsequent step of combining the individual received-signals of the antenna elements, respectively.

23. An OFDM receiver according to claim 15, wherein the detecting means detects the beginning of said number of periods by detecting when the detected energy of the received signal samples in a period exceeds a prescribed threshold level.

24. An OFDM receiver according to claim 15, wherein the means for determining one or more of time synchronization, carrier frequency offset and channel estimation by detecting a maximum amplitude of the cross-correlation output of the FIR uses other FIR output peaks in addition to said maximum amplitude.

25. An OFDM radio receiver having an array antenna comprising a plurality of antenna elements each for receiving an individual received signal comprising data packets each comprising a preamble training sequence having a periodic structure, and signal acquisition means operable, for each antenna element, for:

(i) sampling its received individual radio signal to obtain a series of received-signal samples;

(ii) filtering said samples using a matched finite impulse response (FIR) filter having an impulse response matched to said periodic structure of said preamble training sequence;

(iii) detecting a series of peaks at the output of said filter, each peak corresponding to one received OFDM symbol of the preamble training sequence;

(iv) detecting a maximum amplitude of the cross-correlation output among said peaks from said FIR; and (v) determining a channel estimate (CE) as the magnitude and phase of said maximum amplitude; and (vi) using said magnitude and phase to weight corresponding data for that antenna element in a subsequent step of combining the individual received-signals of the antenna elements, respectively;

(vii)(a) extracting the phase difference between two of said peaks, (vii)(b) calculating from said phase difference the phase shift induced per sample by carrier frequency offset, said phase difference being a multiple of said phase shift with the multiplication factor between the two being determined by the separation of the two peaks;

(viii) obtaining a combined phase shift estimate by adding such estimates for all antenna elements, each being previously weighted by the corresponding channel magnitude determined in step (v);

(ix) the combined phase shift estimate being used for carrier offset correction during subsequent processing steps, preferably after a signal sample has been anticipated by a complex coefficient of unit magnitude which is the inverse of said phase shift.

26. An OFDM receiver having an array antenna comprising a plurality of antenna elements each for receiving an individual received signal comprising data packets each comprising a preamble training sequence having a periodic structure, and signal acquisition means operable, for each antenna element, for:

(i) sampling its individual received signal to obtain a series of received-signal samples;

(ii) filtering the preamble samples using a matched finite impulse response (FIR) filter having an impulse response matched to said periodic structure of said preamble training sequence;

(iii) detecting a series of peaks at the output of said filter, each peak corresponding to one received OFDM symbol of the preamble training sequence;

(iv) detecting a maximum amplitude of the cross-correlation output among said peaks from said FIR; and (v) providing the timing of said maximum amplitude on any given antenna, or any combined signal created by combining the filter outputs at all antennas, as a timing reference for demodulation of said received data;

(vi) determining magnitude and phase of said maximum amplitude; and (vii) using said magnitude and phase to weight corresponding data for that antenna element in a subsequent step of combining the individual received-signals of the antenna elements, respectively;

(viii)(a) extracting the phase difference between two peaks, where said two peaks can be two consecutive peaks or can be more widely separated;

(viii)(b) calculating from said phase difference the phase shift induced per sample by the carrier frequency offset, said phase difference being a multiple of said phase shift with the factor between the two being determined by the separation of the two peaks;

(ix) adjusting a phase shift estimate by adding such estimate for all antennas, each being previously weighted by the corresponding channel magnitude determined in step (vi); and (x) the adjusted phase shift estimate being used for carrier offset correction during subsequent processing steps.

27. A receiver according to claim 26, wherein the signal acquisition means uses said phase shift to correct for said carrier frequency offset comprises the step of multiplying a signal sample by a complex coefficient of unit magnitude which is the inverse of said phase shift.

28. An OFDM receiver for receiving signals comprising data packets each comprising a preamble training sequence having a periodic structure, and having signal acquisition means comprising means for:

(i) sampling a received OFDM radio signal to obtain a series of received-signal samples;

(ii) filtering the preamble samples using a matched finite impulse response (FIR) filter having an impulse response matched to said periodic structure of said preamble training sequence, said filtering being preceded by a complex multiplication by a correction coefficient for dynamic carrier frequency offset compensation, said coefficient being initially equal to 1;

(iii) detecting the first two peaks at the output of said filter, each peak corresponding to one received short OFDM symbol;

(iv)(a) extracting the phase difference between said two peaks;

(iv)(b) calculating from said phase difference the phase shift induced per sample by the carrier frequency offset, said phase difference being a multiple of said phase shift with the factor between the two being determined by the separation of the two peaks;

(v) multiplying the correction coefficient at the multiplier ahead of the matched filtering by a complex value of unit amplitude whose phase is minus the phase shift found in step (iv);

(vi) pursuant to the filtering step, updating the correction coefficient for every received peak as a function of the last received two peaks according to steps (iii)-(v);

(vii) detecting a maximum amplitude of the cross-correlation output among said peaks from said FIR; and (viii) providing the timing of said maximum amplitude as a timing reference for demodulation of said received data;

(ix) providing the final value of the correction coefficient as a measure of the carrier frequency offset for its compensation in subsequent steps.

29. An OFDM receiver having an array antenna comprising a plurality of antenna elements each for receiving an individual received signal comprising data packets each comprising a preamble training sequence having a periodic structure, the receiver having signal acquisition means for estimating and correcting carrier frequency offset and estimating from each of said individual received signals characteristics of a transmission channel whereby said individual received signal was received, the signal acquisition means being operable, for each antenna element, for:

(i) sampling a received OFDM radio signal to obtain a series of received-signal samples;

(ii) filtering the preamble samples using a matched finite impulse response (FIR) filter having an impulse response matched to said periodic structure of said preamble training sequence, said filter being preceded by a complex multiplication by a correction coefficient for dynamic carrier frequency offset compensation, said correction coefficient being initially equal to 1;

(iii) detecting the first two peaks at the output of said filter, each peak corresponding to one received short OFDM symbol;

(iv) determining magnitude and phase of the maximum amplitude out of the said two peaks, for each antenna, said magnitude and phase constituting the current estimate of the channel coefficient associated with each antenna;

(v)(a) extracting the phase difference between said two peaks on each antenna;

(v)(b) calculating from said phase difference the phase shift induced per sample by the carrier frequency offset, said phase difference being a multiple of said phase shift with the factor between the two being determined by the separation of the two peaks;

(vi) expressing said phase shift on each antenna by a complex coefficient of unit magnitude, computing the weighted normalized sum of all such coefficients for all antennas, where the weight associated with a specific coefficient is proportional to the current channel gain estimate on the same antenna;

(vii) multiplying the correction coefficient at the multiplier ahead of the matched filter by a complex value of unit amplitude whose phase is minus the phase shift found in the normalized sum operation of step (vi);

(viii) pursuant to the filtering operation, updating the current channel estimate and the correction coefficient for every received peak as a function of the last received two peaks according to steps (iii)-(vii)

(ix) detecting a maximum amplitude of the cross-correlation output among said peaks from said FIR; and (x) determining magnitude and phase of said maximum amplitude; and (xi) using said magnitude and phase to weight corresponding data for that antenna element in a subsequent step of combining the individual received-signals of the antenna elements, respectively;

(xii) providing the final value of the correction coefficient as a measure of the carrier frequency offset for compensation therefor in subsequent steps.

30. An OFDM receiver having an array antenna comprising a plurality of antenna elements each for receiving an individual received signal comprising data packets each comprising a preamble training sequence having a periodic structure, the receiver having signal acquisition means for jointly (A) estimating and correcting carrier frequency offset, (B) recovering timing (synchronizing) and (C) estimating from received signals characteristics of a transmission channel whereby said received signal was received, the signal acquisition means being operable, for each antenna element, for:

(i) sampling its individual received OFDM radio signal to obtain a series of received-signal samples;

(ii) filtering the preamble samples using a matched finite impulse response (FIR) filter having an impulse response matched to said periodic structure of said preamble training sequence, said filtering being preceded by a complex multiplication by a correction coefficient for dynamic carrier frequency offset compensation, said correction coefficient being initially equal to 1;

(iii) detecting the first two peaks at the output of said filter, each peak corresponding to one received OFDM symbol of the training sequence;
(iv) determining magnitude and phase of the maximum amplitude out of the said two peaks, for each antenna, said magnitude and phase constituting the current estimate of the channel coefficient associated with each antenna;
(v)(a) extracting the phase difference between said two peaks on each antenna;
(v)(b) calculating from said phase difference the phase shift induced per sample by the carrier frequency offset, said phase difference being a multiple of said phase shift with the factor between the two being determined by the separation of the two peaks;
(vi) expressing said phase shift on each antenna by a complex coefficient of unit magnitude, computing the weighted normalized sum of all such coefficients for all antennas, where the weight associated with a specific coefficient is proportional to the current channel gain estimate on the same antenna;
(vii) multiplying the correction coefficient at the multiplier ahead of the matched filter by a complex value of unit amplitude whose phase is minus the phase found in the normalized sum operation of step (vi);
(viii) pursuant to the filtering operation, updating the current channel estimate and the correction coefficient for every received peak as a function of the last received two peaks according to steps (iii)-(vii)
(ix) detecting a maximum amplitude of the cross-correlation output among said peaks from said FIR; and
(xi) determining magnitude and phase of said maximum amplitude;
(xii) using said magnitude and phase to weight corresponding data for that antenna element in a subsequent step of combining the individual received-signals of the antenna elements, respectively;
(xiii) providing the timing of said maximum amplitude on any given antenna, or any combined signal created by combining the filter outputs at all antennas, as a timing reference for demodulation of said received data; and
(xiv) providing the final value of the correction coefficient as a measure of the carrier frequency offset for its compensation in subsequent steps.

* * * * *